(12) United States Patent
Muljono et al.

(10) Patent No.: US 10,812,075 B2
(45) Date of Patent: Oct. 20, 2020

(54) DYNAMIC ON-DIE TERMINATION

(71) Applicant: Intel Corporation, Santa Clara, CA (US)

(72) Inventors: Harry Muljono, San Ramon, CA (US); Linda K. Sun, Fremont, CA (US); Maria Jose Garcia Garcia de Leon, Zapopan (MX); Raul Enriquez Shibayama, Zapopan (MX); Abraham Isidoro Munoz, Zapopan (MX); Carlos Eduardo Lozoya Lopez, Thajomulco de Zuñiga (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/417,511

(22) Filed: May 20, 2019

(65) Prior Publication Data
US 2019/0280691 A1      Sep. 12, 2019

(51) Int. Cl.
*H03K 19/00* (2006.01)
*H03K 19/0175* (2006.01)
*G06F 13/40* (2006.01)
*H04L 25/02* (2006.01)

(52) U.S. Cl.
CPC ..... *H03K 19/0005* (2013.01); *G06F 13/4086* (2013.01); *H03K 19/017509* (2013.01); *H03K 19/017545* (2013.01); *H04L 25/0278* (2013.01)

(58) Field of Classification Search
None
See application file for complete search history.

(56) References Cited

U.S. PATENT DOCUMENTS

| | | | | |
|---|---|---|---|---|
| 5,467,455 A | * | 11/1995 | Gay | H03H 7/40 326/30 |
| 6,351,138 B1 | * | 2/2002 | Wong | H04L 25/0298 326/30 |
| 2003/0048113 A1 | * | 3/2003 | Haycock | H04L 25/0276 326/30 |
| 2008/0001621 A1 | * | 1/2008 | Sinha | H03K 19/018557 326/30 |

\* cited by examiner

*Primary Examiner* — Minh D A
*Assistant Examiner* — James H Cho
(74) *Attorney, Agent, or Firm* — Schwabe, Williamson & Wyatt, P.C.

(57) ABSTRACT

An apparatus includes a terminal, a first device coupled to the terminal via a first node, the first device to drive a signal on the terminal via the first node, and a second device coupled to the terminal via a second node, wherein the second device comprises a dynamic on-die termination (ODT) circuit coupled to the second node. The dynamic ODT circuit includes: a bus holder circuit to receive the signal from the first device at the second node and select a termination voltage based on the signal, a response delay circuit coupled to the bus holder circuit, the response delay circuit to delay application of the termination voltage to the second node, and a time blanking delay circuit coupled to the bus holder circuit and the response delay circuit to prevent the termination voltage from changing before a threshold period of time elapses.

19 Claims, 14 Drawing Sheets

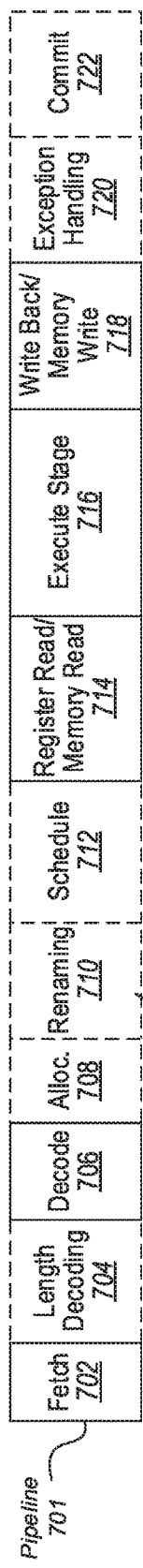
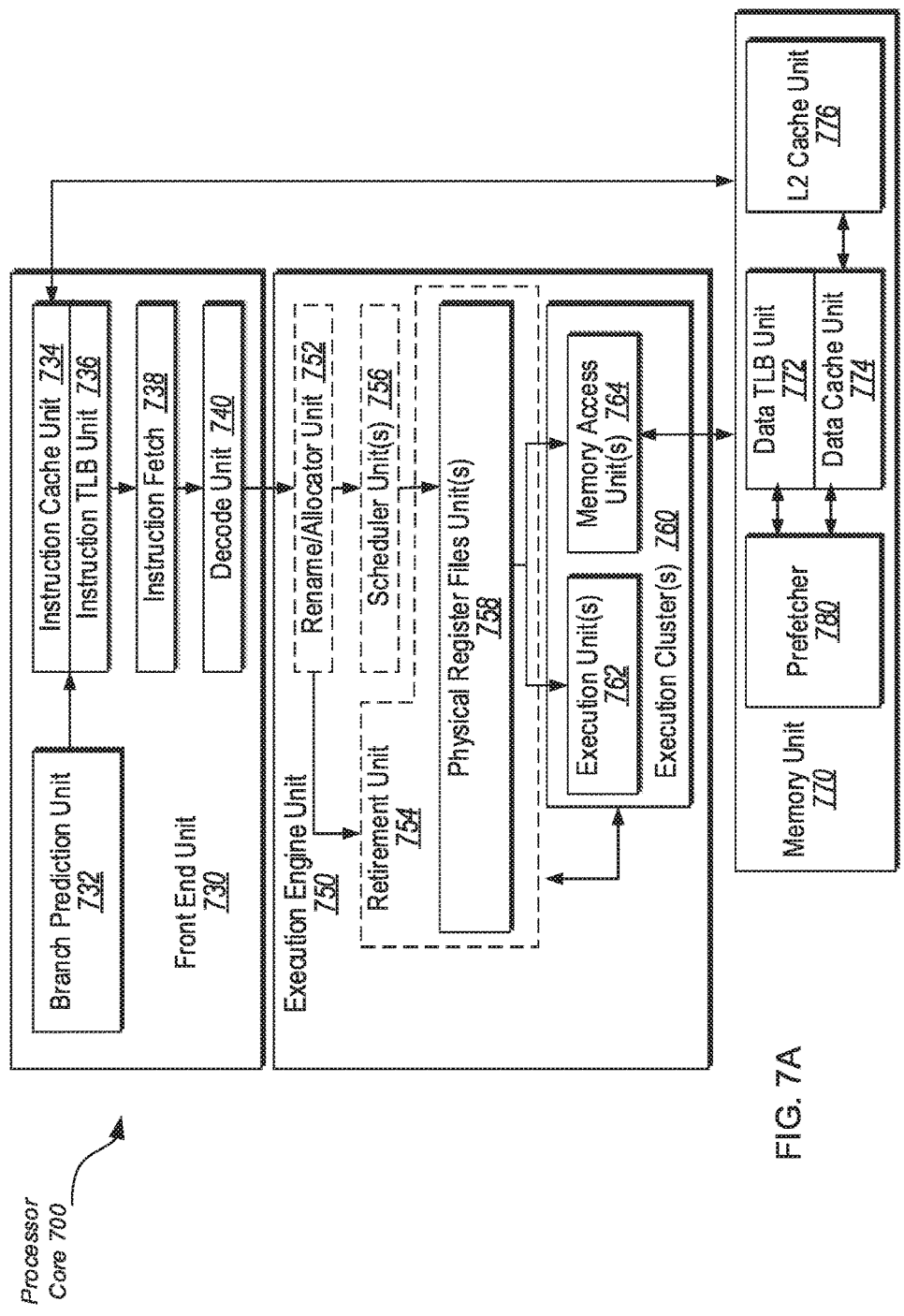
FIG. 7B
FIG. 7A

DYNAMIC ON-DIE TERMINATION

TECHNICAL FIELD

This disclosure generally relates to computer technology, and more specifically to on-die signal termination in multi-chip packages.

BACKGROUND

Multi-chip packages include multiple integrated circuits that are integrated into a single chip. On-die signal termination includes the use of termination impedance located on a chip, or die. Signal termination can include matching a termination impedance to a characteristic impedance of the circuit to reduce signal reflection.

BRIEF DESCRIPTION OF THE DRAWINGS

FIG. 7A is a block diagram illustrating an in-order pipeline and a register renaming stage, out-of-order issue/execution pipeline according to one embodiment.

FIG. 7B is a block diagram illustrating a micro-architecture for a processor or an integrated circuit that may implement hardware support for dynamic ODT, according to an embodiment of the disclosure.

DETAILED DESCRIPTION

Figure 1:
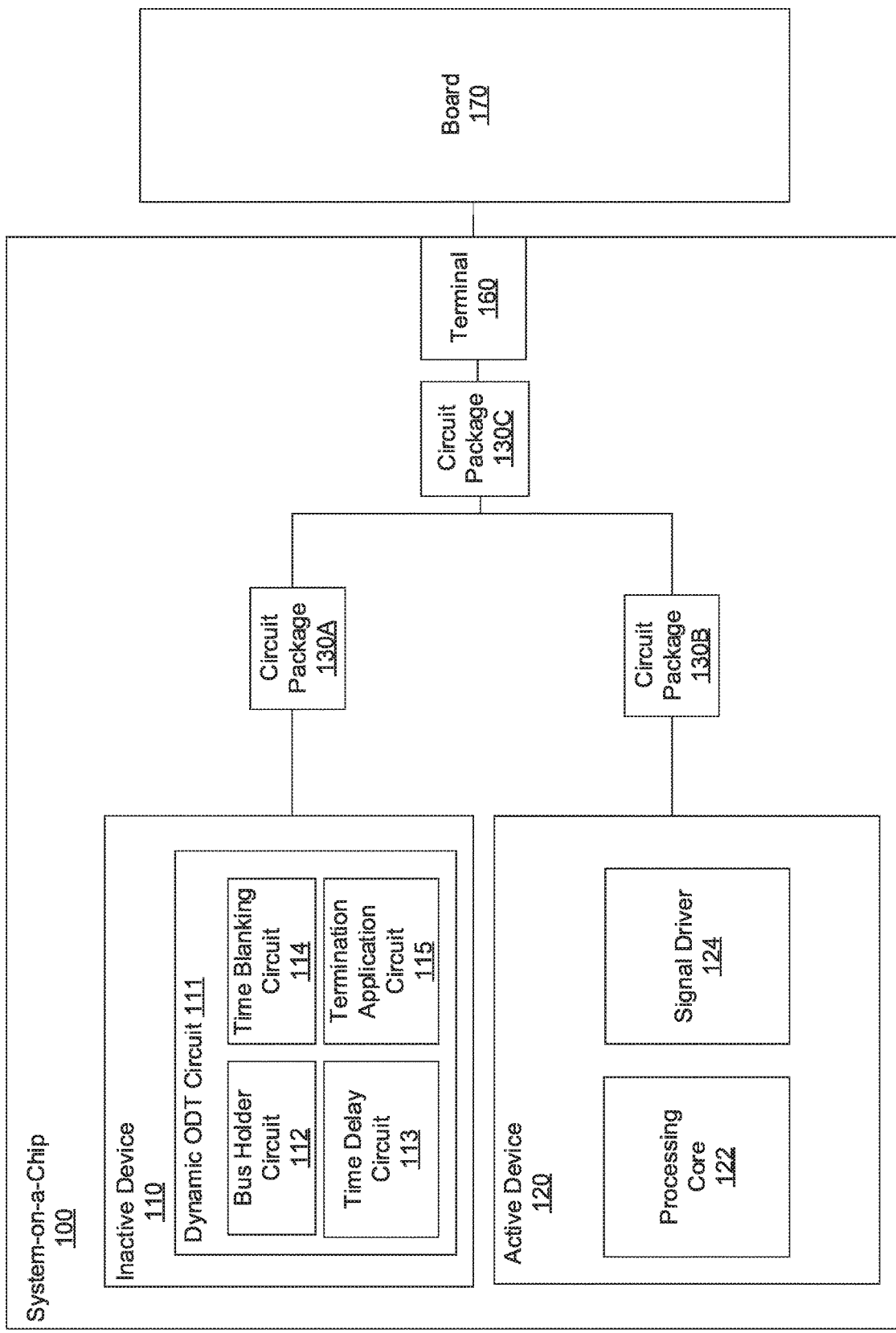
FIG. 1 is a block diagram illustrating a multi-chip package utilizing dynamic on-die termination (ODT) in an inactive device according to one embodiment.

A multi-chip package (MCP) may include multiple dies integrated onto one circuit such that the multi-chip package is in essence an integrated circuit made up of integrated circuits. In some implementations of MCPs, the pin count leading to the MCP may need to be reduced due to limited space. In such an instance, a single-ended parallel bus can be used to connect a single pin, or terminal, of a MCP to two different devices located on the MCP. As with circuits in general, a termination circuit is needed to prevent, or reduce, signal reflection at device interfaces. In particular, in a single-ended parallel bus interface in which one device is inactive and the other device is actively driving a signal, it may be necessary to provide for signal termination at the inactive device to reduce signal reflection at the inactive device. Reducing signal reflection using ODT can significantly reduce noise in the circuit.

Signal termination may be done in several ways. First, high impedance at an inactive device, which is not considered signal termination, can be used at an inactive device. However, this significantly limits the package length of the two branches in the single-ended parallel bus scheme due to interference from signal reflections. Second, adding a silicon feature that provides static ODT helps to support longer package lengths than no termination because reflections are reduced but can significantly impact direct current (DC) margins because static ODT uses a voltage divider, again reducing the maximum achievable frequency. Additionally, static ODT can make it difficult to implement debug tools that require higher eye height (EH) margins to function properly.

To address the above deficiencies, the present disclosure uses dynamic ODT to reduce signal reflection at an inactive device. Dynamic ODT may determine a termination voltage based on a signal that is received from another device in a single-ended parallel bus configuration. Thus, the termination voltage can be adjusted to match the voltage of the received signal, clamping the signal down and reducing reflection of the signal. In addition, application of the selected termination voltage can generate a signal that supplements the original signal at the probe point located off the MCP integrated circuit.

For example, a first device and a second device may both be connected to the same pin, or terminal, of the MCP in a single ended parallel bus interface. The first device may be active and driving a signal that is to be transmitted off the MCP to a motherboard or other device, chip, or silicon feature through the single terminal. However, part of the signal may be transmitted through the parallel line leading to the inactive device at the point where the two parallel lines connect to the single-ended interface (i.e. where the transmission line bifurcates). When the signal is received at the second device, a dynamic termination circuit on the second device may detect the signal and then select a termination voltage based on the signal. In one example, the selected termination voltage of the dynamic termination circuit is not immediately applied. Rather, a time delay circuit may cause the termination voltage to slowly be applied to an output of the termination circuit so that ringing does not occur in the circuit due to immediate application of the termination voltage. In addition, a time blanking circuit may be used to ensure that once a valid signal is received and the termination voltage is selected that no noise can change the termination voltage for some defined period of time. Such a time blanking circuit may prevent changes of the termination voltage due to noisy transitions rather than a valid signal.

Aspects of the present disclosure address the above and other deficiencies by providing dynamic ODT as described herein. Advantages of the present disclosure include, but are not limited to, reducing signal reflection in single-ended parallel bus circuits. By using dynamic ODT, aspects of the present disclosure can provide for longer package lengths while terminating reflections without impacting DC levels. Aspects of the present disclosure can be used for higher frequency debug signals and strict debug tool eye height (EH) mask.

FIG. 1 is a block diagram illustrating a system-on-a-chip (SOC) 100 utilizing dynamic on-die termination in an inactive device 110. The SOC 100 may be a MCP where more than one chip, or device, is integrated into the SOC 100. The SOC 100 may include an inactive device 110, an active device 120, and one or more circuit packages 130A-C incorporated into transmission lines connected to an interface terminal 160.

The inactive device 110 may be a central processing unit (CPU), a memory device, a processing core, or any other device that may be incorporated into a MCP. The inactive device 110 may be dormant while the active device 120 drives a signal. In one example, the inactive device 110 may become inactive in response to the active device 120 driving the signal. However, the inactive device 110 may become active at a later time, for example when the active device 120 ceases driving the signal. For signal termination, the inactive device 110 may include a dynamic ODT circuit 111 to dynamically select a termination voltage at the inactive device 110. The dynamic ODT circuit 111 may help to reduce reflections of signals driven by the active device 120 at an interface of the inactive device 110. The dynamic ODT circuit 111 may include a receiver circuit comprising a bus holder circuit 112, a time delay circuit 113, and a time blanking circuit 114. The dynamic ODT circuit may also include a termination application circuit 115. The SOC may be coupled to a board 170, such as a motherboard where the intended signal destination may be located.

The bus holder circuit 112 may receive and detect the signal from the active device 120. After detecting the signal, the bus holder circuit 112 can select a termination voltage that is to be applied at an interface of the inactive device 110 by the termination application circuit 115. The termination application circuit 115 may be used to prevent signal reflection, or "clamp down," the signal. The bus holder circuit 112 may include an inherent hysteresis which ensures that the termination voltage is selected, or changed, only upon detecting a signal that has a voltage that either exceeds a high threshold, or drops below a low threshold. For example, the bus holder circuit 112 may include, or be coupled to, a Schmitt trigger to provide the inherent hysteresis.

Once the input signal is received at the bus holder circuit 112 and the bus holder circuit 112 selects a termination voltage, the time delay circuit 113 may delay propagation of the selected termination voltage to the termination application circuit 115 of the dynamic ODT circuit 111. In this way, there is not an immediate voltage change at the termination application circuit 115 and ringing due to such a sudden change in termination is prevented. The time delay circuit 113 may include one or more inverters and/or other logic components that may delay propagation of the voltage to be applied. The time delay circuit 113 may be programmable to select an appropriate time delay for application of the termination voltage. In addition to the time delay circuit 113, the dynamic ODT circuit 111 may include a time blanking circuit 114. The time blanking circuit 114 may hold the selected termination voltage steady for a defined period of time so that noise in the circuit does not cause a transition of the termination voltage during that period of time. The period of time that the time blanking circuit 114 prevents transition may be tunable, or programmable, so that adjustments can be made to optimize termination according to different signal frequencies and other variables of the circuit. For example, the time blanking circuit 114 may include one or more inverters or other logic gates/circuits that can be adjusted to tune the time over which the termination voltage is to remain unchanged.

The termination application circuit 115 may receive the termination voltage selected by the bus holder circuit 112 and apply the termination voltage to the transmission line to terminate the received signal. For example, the termination application circuit 115 may be a circuit to directly apply the selected termination voltage to the interface of the inactive device 110. Alternatively, the termination application circuit 115 may include a circuit of one or more electrical components (e.g., resistor, capacitor etc.) and/or logic gates through which the termination voltage is applied and which is coupled to the interface of the inactive device 110 and the transmission line.

The active device 120 may be a central processing unit (CPU), a memory device, a processing core, or any other device capable of driving a signal that may be incorporated into a MCP. The active device 120 may drive a signal for purposes of debugging the active device, or alternatively the active device 120 may be driving the signal for an application or process executed by the active device 120. The active device 120 may include a processing core 122 for receiving and executing instructions, and a signal driver 124 to drive a signal that results from the operation of processing core 122. The signal driver 124 may be controlled by the processing core 122, a memory management unit, an input/output management unit, or any other device that may process and transmit communications from the active device 120. The signal driver 124 may drive a signal high or low, representing a logical 1 or 0. The signal driver 124 may be an input/output device or other control unit to drive data/clock patterns. The active device 120 may include a dynamic ODT circuit that is the same or similar to dynamic ODT circuit 111 for dynamic ODT when the active device 120 becomes inactive.

Packages 130A-C may be integrated circuits or other circuits/components of the MCP. The size and length of the packages may impact the signal integrity of the circuit. Dynamic ODT allows for the lengths of the packages 130A-C to be significantly increased in comparison to no termination and static ODT, providing for more flexibility in package design. Terminal 160 may be any terminal or interface to connect the MCP to a motherboard, another integrated circuit, or any chip or package external to the MCP. Thus, in the single-ended parallel interface, the single terminal 160 may be a terminal to access and communicate with both the inactive device 110 (which may become active) and the active device 120. Board 170 may be a motherboard to which the terminal 160 connects the MCP. Alternatively, board 170 may be any other chip, integrated circuit, device, or connection.

It should be noted that FIG. 1 is merely illustrative and should not be construed as limiting. The components may be configured in any number of ways and some examples may include more components or fewer components than depicted.

Figure 2:
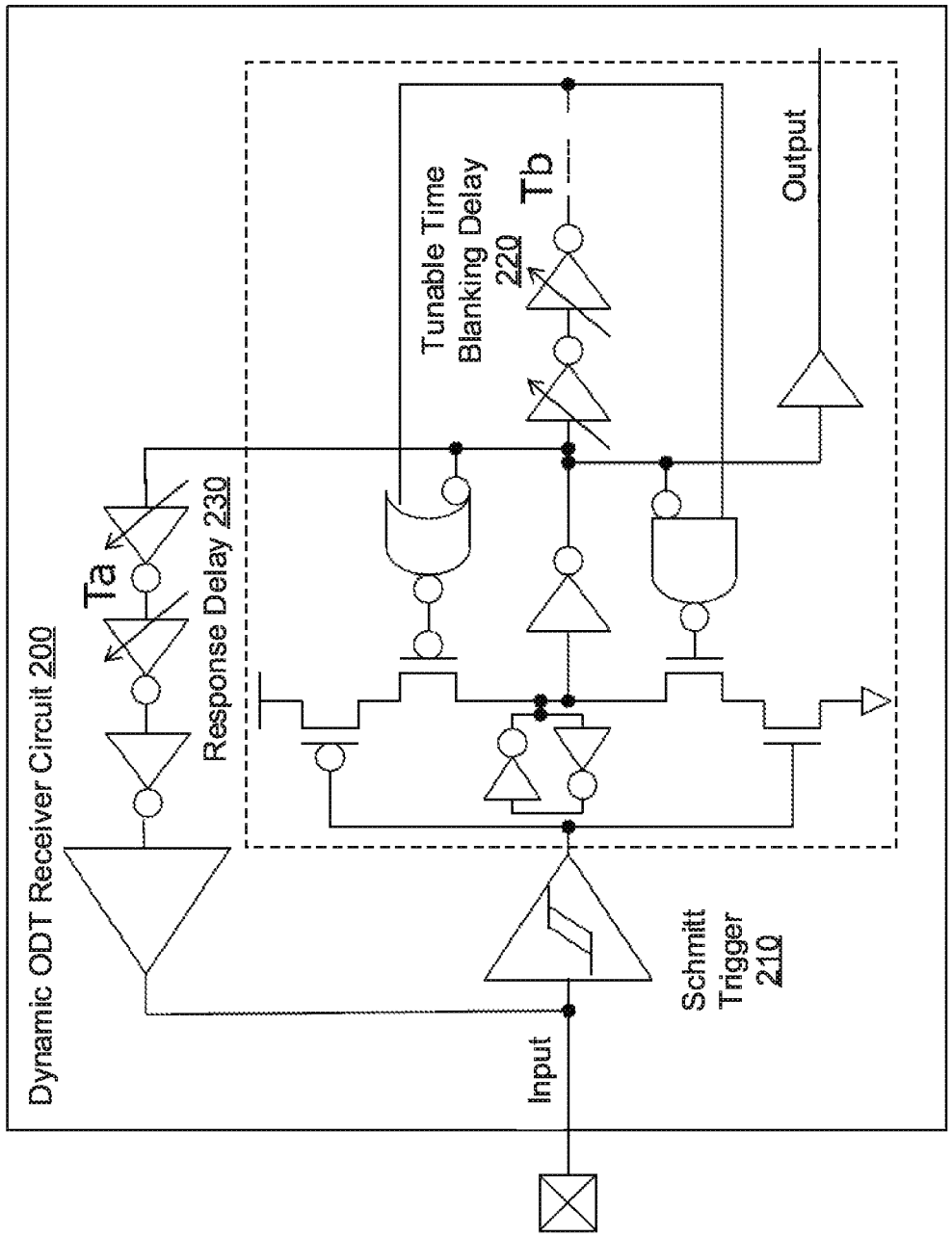
FIG. 2 is a block diagram illustrating a system-on-a-chip with dynamic on-die termination according to one embodiment.

FIG. 2 is a block diagram illustrating an example dynamic ODT circuit 200. The example dynamic ODT receiver circuit 200 may include a Schmitt Trigger 210, a tunable time blanking delay circuit 220, and a response delay 230, each of which may be the same or similar to bus holder circuit 112, time blanking circuit 114, and time delay circuit 113 of FIG. 1, respectively. It should be noted that the dynamic ODT receiver circuit 200 is only one possible implementation of a dynamic ODT receiver circuit. Any number of different combinations of logical and/or physical circuity may be used to implement the dynamic ODT receiver circuit 200.

The Schmitt trigger 210 may be a circuit that contains an inherent hysteresis such that an output of the Schmitt trigger 210 changes only when a high or low threshold signal voltage is satisfied. The output of the Schmitt trigger 210 may then be used to select the termination voltage. In this way, the termination voltage only changes when a signal that satisfies one of the threshold signal voltages is received. The Schmitt trigger and the termination voltage selection scheme may then be coupled with the tunable time blanking delay circuit 220. Therefore, once the termination voltage is selected, the termination voltage may remain stable for a tunable amount of time, depending on characteristics of the circuit. Finally, the response delay 230 coupled with the termination selection scheme is used to delay the application of the termination voltage to the output of the dynamic ODT circuit 200. The delay may be imposed by placing inverters in the circuit to slow propagation of the signal, or other components that may reduce the propagation speed of the signal from the selection to the output.

Figure 3:
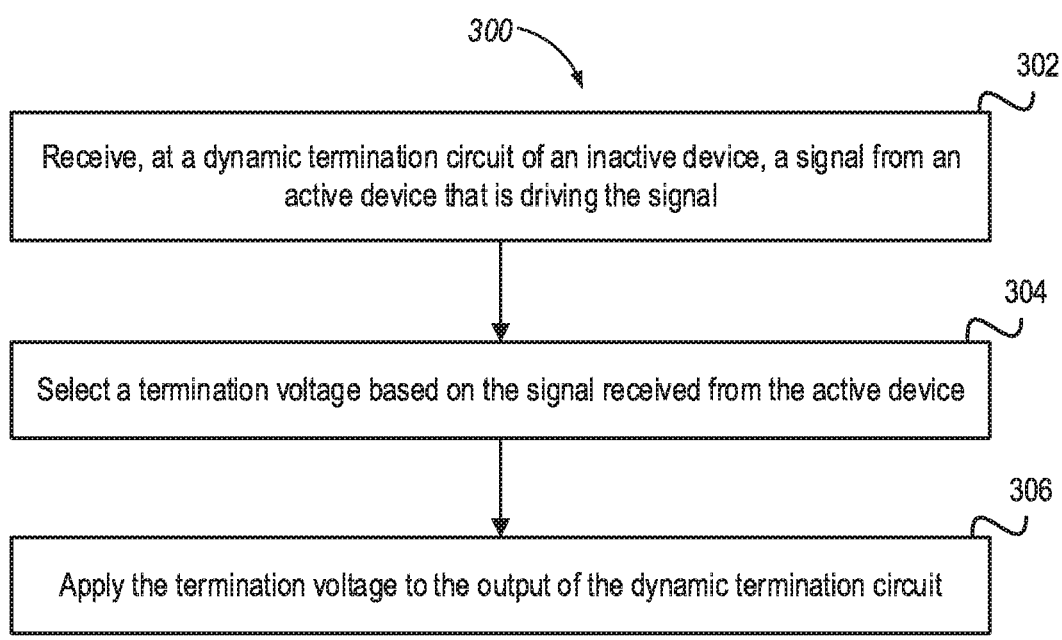
FIG. 3 is a flow diagram illustrating an example method of using dynamic on-die termination in an inactive device to reduce signal reflection according to one embodiment.

FIG. 3 is a flow diagram illustrating an example method 300 of using dynamic ODT to reduce signal reflection. At block 302, a dynamic termination circuit of an inactive device receives a signal from an active device at an interface, or node, of the inactive device. The active device may drive the signal and may be situated in a single ended parallel bus interface with the inactive device. Therefore, the signal received at the inactive device may be terminated using the dynamic termination circuit, as described below, so that signal reflections do not interfere with the driven signal at an intended signal destination.

At block 304, the dynamic termination circuit selects a termination voltage based on the signal received from the active device. The signal may be driven high (higher than a threshold voltage to indicate a logical high) or low (lower than a low threshold voltage to indicate a logical low) by the active device If the signal is driven high then the termination circuit may select a high termination voltage, while if the signal is driven low then the termination circuit may select a low termination voltage. The high termination voltage may be the same voltage as the high signal and the low termination voltage may be the same as the low signal voltage. The termination voltage may also be values other than the signal voltage.

The termination circuit may also include a bus holder circuit with an internal hysteresis (e.g., a Schmitt trigger scheme). Accordingly, the signal must exceed a high voltage threshold to change the termination voltage from low to high, or drop below a low voltage threshold to change the termination voltage from high to low. For example, if the termination voltage is low from a previous selection then a signal that exceeds a high voltage threshold is required to change the termination voltage to high. If the termination voltage is high from a previous selection then a signal that drops below a low voltage threshold is required to change the termination voltage to low. However, if a signal fluctuates in between the high and low thresholds but does not exceed them, then the termination voltage may remain the same.

At block 306, a termination application circuit of the dynamic termination circuit applies the termination voltage to an output of the termination circuit. The output of the dynamic termination circuit may be coupled to the interface of the inactive device to terminate the received signal. The termination application circuit may be a circuit that receives the selected termination voltage and applies the termination voltage to the interface through one or more electrical components. For example, the termination application circuit may become a pull-up termination circuit when a high termination voltage is selected and may become a pull-down termination circuit when a low termination voltage is selected.

Furthermore, since the termination voltage follows the signal voltage, application of the termination voltage may supplement the initial signal after some delay due to the design of a transmission path. For example, the original signal may propagate to a probe point but part of the signal is transmitted to the inactive device. Upon receiving the signal, the termination voltage is applied according to the signal. The applied termination voltage may then propagate to the probe point. A delay results from the signal travelling to and from the inactive device before reaching the probe point, while the original signal only had to travel to the probe point. Therefore, the frequency of the signal may be limited by the propagation delay of the signal from the active device to the inactive device.

Figure 4:
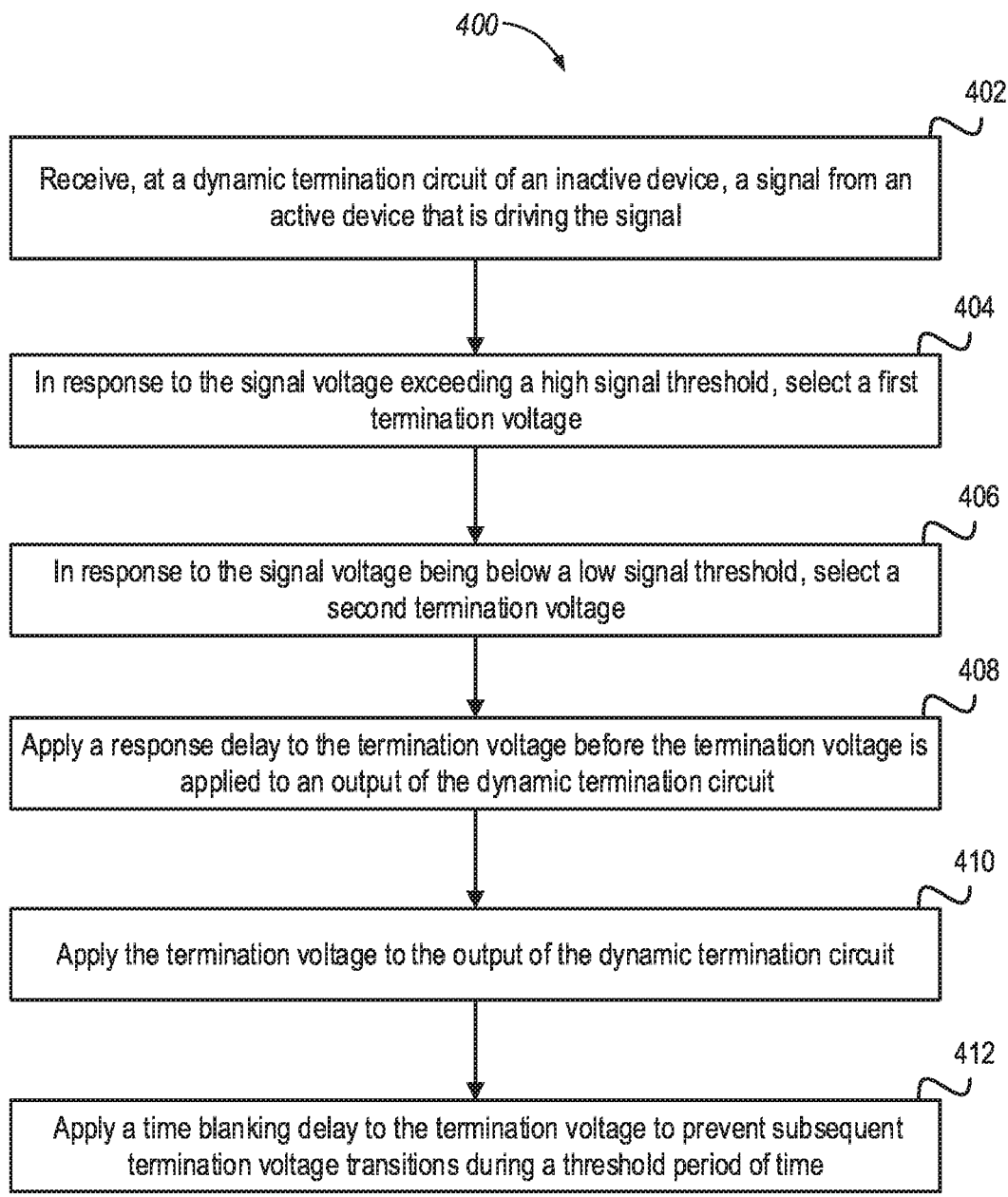
FIG. 4 is a flow diagram illustrating an example method of performing dynamic ODT in an inactive device of a multichip package according to one embodiment.

FIG. 4 is a flow diagram illustrating an example method 400 of performing dynamic ODT in an inactive device of a multichip package. At block 402, a dynamic termination circuit of an inactive device receives a signal from an active device at an interface, or node, of the inactive device. The active device may drive the signal and may be situated in a single ended parallel bus interface with the inactive device. The signal received at the inactive device is terminated, as described below, so that reflections of the signal at the inactive device interface do not interfere with the driven signal.

At block 404, in response to the signal exceeding a high signal threshold, select a first termination voltage. The first termination voltage may be a high termination voltage that represents a logical high within the circuit. The first termination voltage may be selected by a bus holder circuit that includes an internal hysteresis, such as a Schmitt trigger. Therefore, if the termination voltage is low then it will stay low until the signal voltage exceeds the high voltage threshold. If the termination voltage is already high then it will remain high as it continues to receive a signal voltage that is high.

At block 406, in response to the signal being below a low signal threshold, select a second termination voltage. The second termination voltage may be a low termination voltage that represents a logical low within the circuit. The second termination voltage may also be selected by the bus holder circuit with internal hysteresis. Thus, if the termination voltage is high then it will stay high until the signal voltage drops below the low voltage threshold. If the termination voltage is already low then it will remain low when receiving a low voltage.

At block 408, apply a response delay to the selected termination voltage before the termination voltage is applied to an output of the dynamic termination circuit. The response delay may include one or more inverters to reduce propagation speed of the selected termination voltage. Alternatively, other circuit components and/or logic gates may be used to delay propagation of the termination voltage to the output of the circuit. The response delay may be programmable. For example, the response delay may include one or more variable inverters that may be programmed to change the propagation delay. The delay may prevent a ringing effect in the circuit that could result from immediate application of the termination voltage to the output of the termination circuit.

At block 410, apply the termination voltage to the output of the termination circuit. Applying the termination voltage to the output of the termination circuit may include providing the termination voltage to a termination application circuit. The termination application circuit may be a termination circuit that applies the termination voltage to an interface, or node, of the inactive device. For example, the termination application circuit may become a pull-up termination circuit when a high termination voltage is selected and may become a pull-down termination circuit when a low termination voltage is selected. The node may connect the output of the termination application circuit to a terminal of the chip on which the devices are included. The terminal may connect to motherboard, breadboard, or other off chip interface/connection. Upon the application of the termination voltage to the output of the termination circuit, application of the termination voltage may generate a signal component that propagates to the terminal and supplements the original signal being driven by the active device.

At block 412, apply a time blanking delay to the termination voltage to prevent subsequent termination voltage transitions during a threshold period of time. The time blanking delay ensures that the termination voltage is selected based on the signal driven by the active device and not by other subsequent noise. The time blanking delay may include one or more variable inverters to stabilize the output for a certain period of time before allowing a new signal to select a new termination voltage. The variable inverters may allow the time blanking delay to be programmed so that the circuit can be optimized to reduce signal reflections. The time blanking delay may be a feedback loop that keeps the termination voltage constant, or within an acceptable range, for the threshold period of time.

Figure 5A:
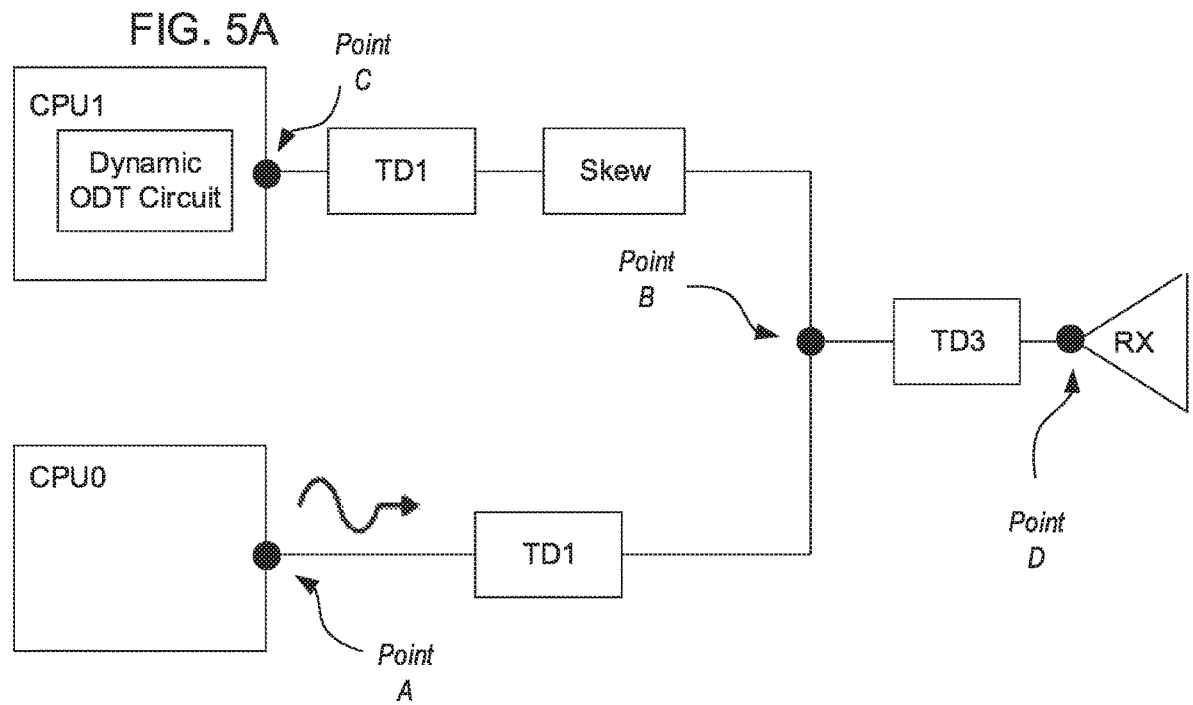
FIG. 5A depicts an example single ended parallel bus interface with an active processing device (CPU0) and an inactive processing device (CPU1) according to one embodiment.

FIG. 5A depicts an example single ended parallel bus interface with a first processing device (CPU0) that is in an active state and driving a signal and a second processing device (CPU1) that is in an inactive state with dynamic ODT. FIG. 5A further illustrates the propagation of the signal from CPU0 including time delays in the circuit (TD1, TD3, and Skew). Each of the time delays may be due to the structure of the circuit. In one example, CPU0 drives a signal that is transmitted from Point A to Point B. Part of the signal may then be transmitted to Point D, while another part of the signal may be transmitted to Point C, and in some instances part of the signal may be reflected at point B back toward point A. The part of the signal that is transmitted to Point C is terminated using the dynamic ODT circuit. Therefore, there is little to no signal reflection from point C to interfere with the signal that reaches Point D. In addition, as a result of applying a selected termination voltage at Point C, a signal component may be generated in and transmitted to Point B and then Point D. The signal component may supplement the original signal at point D. This example is further illustrated with respect to FIG. 5B.

Figure 5B:
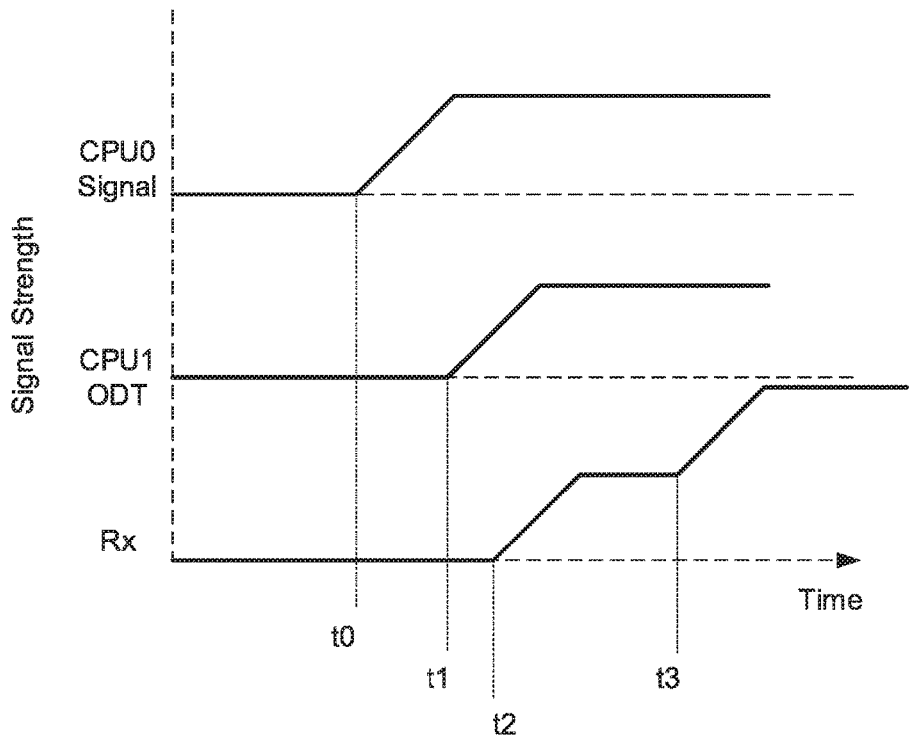
FIG. 5B depicts the signal, or voltage level, at three points in the circuit over a period of time that illustrates the circuit's response to the signal driven by an active device according to one embodiment.

FIG. 5B depicts the signal, or voltage level, at three points in the circuit over a period of time that illustrates the circuit's response to the signal driven by CPU0. The signal from CPU0 at Point A is depicted at the top of the graph. At time t0, the CPU0 begins to drive the signal high. Then as depicted in the graph, the signal reaches CPU1 ODT at time t1. The time delay between t0 and t1 can be calculated based on the structure of the circuit. As depicted in FIG. 5A, to get between Point A and Point C the signal must travel through two components with a time delay 1 (TD1), and an additional delay (skew) is accounted for. Thus, the delay between Point A and Point C is equal to (2TD1+Skew). At time t3, the signal reaches Rx (Point D). The path from Point A to Point D includes TD1 and TD3. Thus, the time delay between t0 and t2 is equal to (TD1+TD3). Finally, at t3 the termination voltage applied by the ODT circuit of CPU1 reaches Rx (Point D). Using the same time delays from above, the time delay between t0 and t3 is (3TD1+2Skew+TD3). Thus, as can be seen at t3, the signal component generated by applying the termination voltage at CPU1 supplements the signal received at Point D at that time. The increase in signal strength may thus increase the DC signal margins received at Rx (Point D).

In addition to the time delays described above due to the structure of the circuit, the dynamic ODT may introduce a time delay as well (referred to herein as "Td"). In order for the signal component generated by application of the termination voltage to supplement the signal at Point D, the frequency of the signal may be limited. If the component generated by the termination voltage does not reach Point B before the next signal driven by CPU0 then the signal may be corrupted. Thus, a limiting equation may be defined to ensure proper functioning of the circuit: 2(TD1+skew)+Td≤Unit Interval.

Figure 6A:
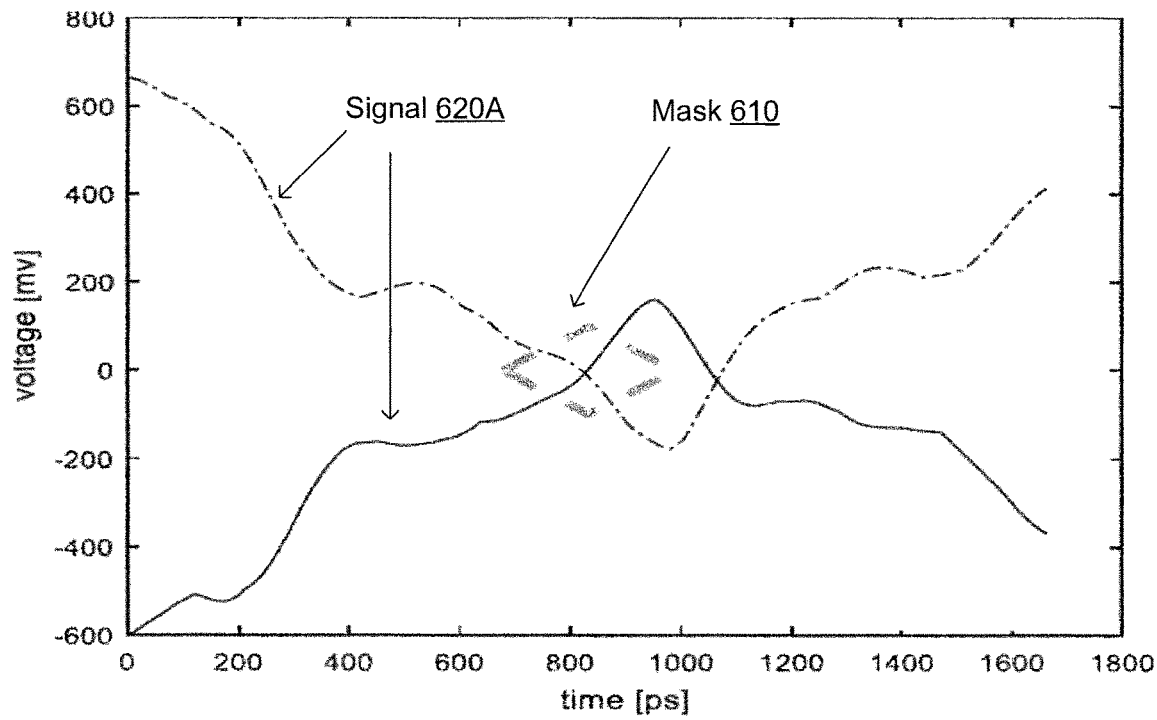
FIG. 6A is an eye diagram depicting example direct current margins in a debug probe for a single-ended parallel bus interface without termination at an inactive device according to one embodiment.
Figure 6B:
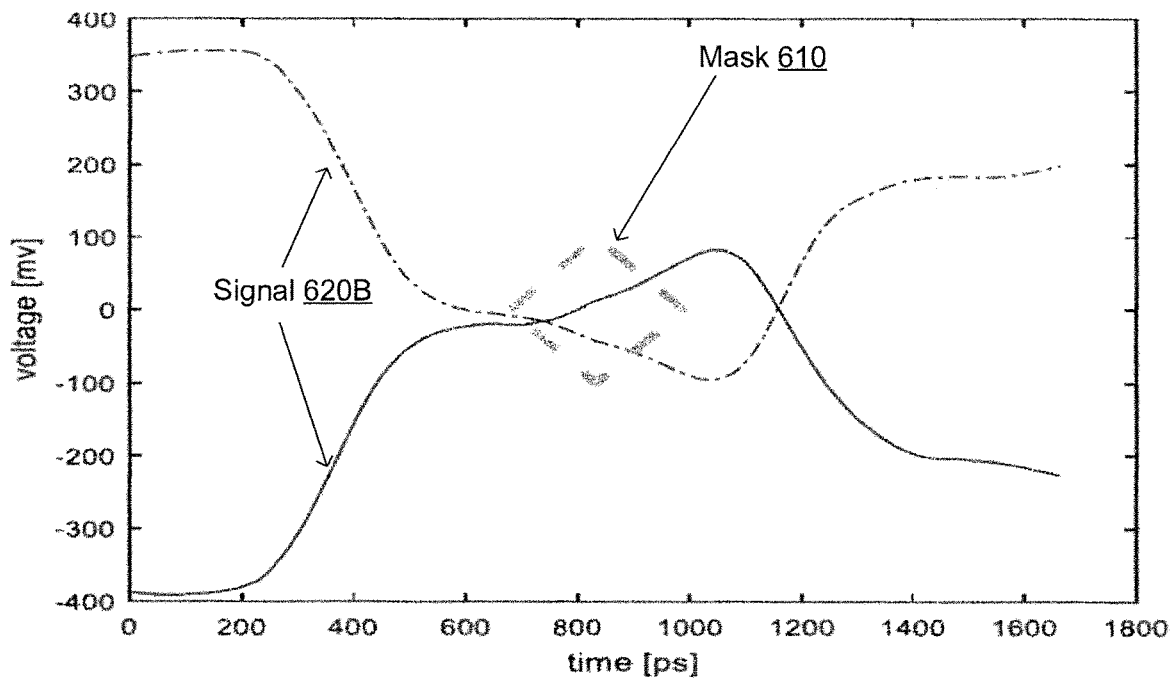
FIG. 6B is an eye diagram depicting example direct current margins in a debug probe for a single-ended parallel bus interface with static ODT at an inactive device according to one embodiment.
Figure 6C:
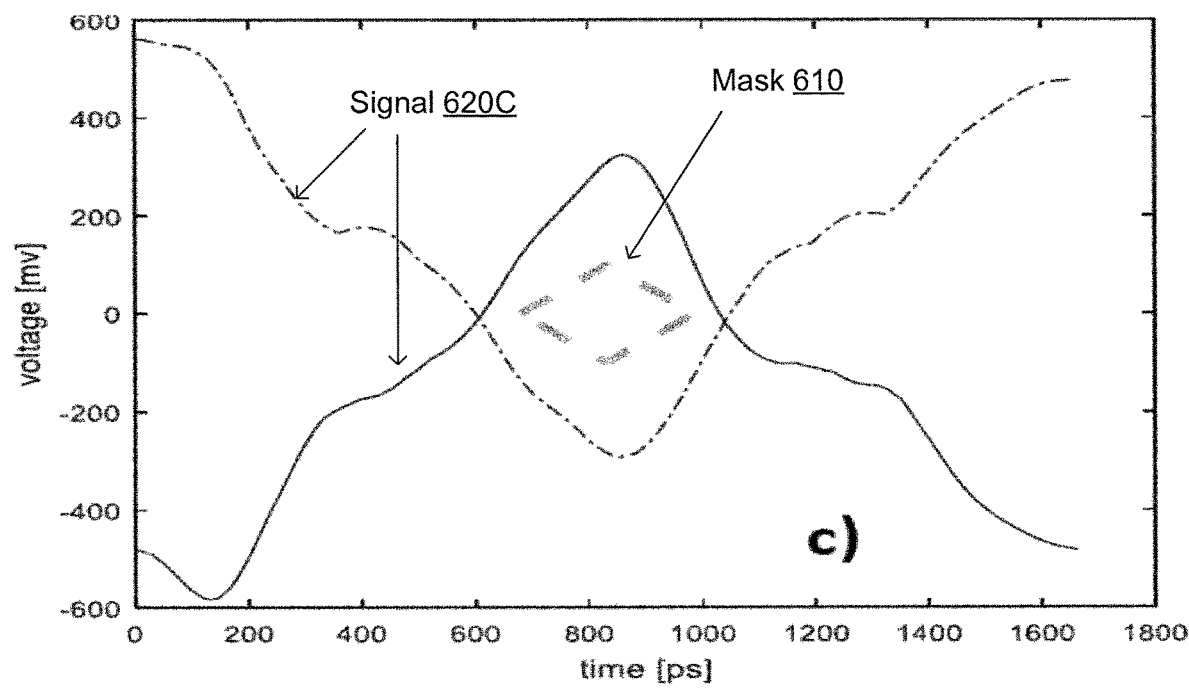
FIG. 6C is an eye diagram depicting example direct current margins in a debug probe for a single-ended parallel bus interface with dynamic ODT at an inactive device according to one embodiment.

FIGS. 6A, 6B, and 6C depict example eye diagrams according to some examples in which no termination is applied at an inactive device (FIG. 6A), static on-die termination is used at the inactive device (FIG. 6B), and dynamic ODT is used at the inactive device (FIG. 6C). The eye diagrams represent the signal received at a probe point of a single ended parallel debug port data signal running at 1.2 GT/s. The applied mask 610 has an eye-height of 200 mV and an eye-width of 310 ps, as is used in one standardized debug tool. The eye diagram for the signal 620A received at the probe point when no termination is used, depicted in FIG. 6A, demonstrates that noise in the circuit disrupts the signal 620A received at the probe point. The EH is 336 mV and the EW is 235 ps. Which does not satisfy the applied mask 610. The eye diagram for the signal 620B received at the probe point when static ODT is used demonstrates that although the signal 620B is better than without termination, it still does not satisfy the applied mask 610. Finally, the eye diagram for the signal 620C received at the probe point when dynamic ODT is used demonstrates that the DC margins are plenty sufficient to satisfy the applied mask 610. Therefore, dynamic ODT significantly reduces reflections and noise in the circuit while increasing DC margins.

FIG. 7A is a block diagram illustrating a micro-architecture for a processor 700 that implements hardware support for performing dynamic ODT on an inactive device of a multi-chip package to reduce signal reflection and increase parallel bus margins, according to an implementation. Specifically, processor 700 depicts an in-order architecture core and a register renaming logic, out-of-order issue/execution logic to be included in a processor according to at least one implementation of the disclosure.

Processor 700 includes a front end unit 730 coupled to an execution engine unit 750, and both are coupled to a memory unit 770. The processor 700 may include a reduced instruction set computing (RISC) core, a complex instruction set computing (CISC) core, a very long instruction word (VLIW) core, or a hybrid or alternative core type. As yet another option, processor 700 may include a special-purpose core, such as, for example, a network or communication core, compression engine, graphics core, or the like. In one implementation, processor 700 may be a multi-core processor or may be part of a multiprocessor system.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 740 may be implemented using various different mechanisms. Examples of suitable mechanisms include, but are not limited to, look-up tables, hardware implementations, programmable logic arrays (PLAs), microcode read only memories (ROMs), etc. The instruction cache unit 734 is further coupled to the memory unit 770. The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different scheduler circuits, including reservations stations (RS), central instruction window, etc. The scheduler unit(s) 756 is coupled to the physical register set(s) unit(s) 758. Each of the physical register set(s) units 758 represents one or more physical register sets, different ones of which store one or more different data types, such as scalar integer, scalar floating point, packed integer, packed floating point, vector integer, vector floating point, etc., status (e.g., an instruction pointer that is the address of the next instruction to be executed), etc. The physical register set(s) unit(s) 758 is overlapped by the retirement unit 754 to illustrate various ways in which register renaming and out-of-order execution may be implemented (e.g., using a reorder buffer(s) and a retirement register set(s), using a future file(s), a history buffer(s), and a retirement register set(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 754 and the physical register set(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and operate on various types of data (e.g., scalar floating point, packed integer, packed floating point, vector integer, vector floating point).

While some implementations may include a number of execution units dedicated to specific functions or sets of functions, other implementations may include only one execution unit or multiple execution units that all perform all functions. The scheduler unit(s) 756, physical register set(s) unit(s) 758, and execution cluster(s) 760 are shown as being possibly plural because certain implementations create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register set(s) unit, and/or execution cluster—and in the case of a separate memory access pipeline, certain implementations are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which may include a data prefetcher 780, a data TLB unit 772, a data cache unit (DCU) 774, and a level 2 (L2) cache unit 776, to name a few examples. In some implementations DCU 774 is also known as a first level data cache (L1 cache). The DCU 774 may handle multiple outstanding cache misses and continue to service incoming stores and loads. It also supports maintaining cache coherency. The data TLB unit 772 is a cache used to improve virtual address translation speed by mapping virtual and physical address spaces. In one exemplary implementation, the memory access units 764 may include a load unit, a store address unit, and a store data unit, each of which is coupled to the data TLB unit 772 in the memory unit 770. The L2 cache unit 776 may be coupled to one or more other levels of cache and eventually to a main memory.

In one implementation, the data prefetcher 780 speculatively loads/prefetches data to the DCU 774 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 700 may support one or more instructions sets (e.g., the x86 instruction set (with some extensions that have been added with newer versions); the MIPS instruction set of Imagination Technologies of Kings Langley, Hertfordshire, UK; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated implementation of the processor also includes a separate instruction and data cache units and a shared L2 cache unit, alternative implementations may have a single internal cache for both instructions and data, such as, for example, a Level 1 (L1) internal cache, or multiple levels of internal cache. In some implementations, the system may include a combination of an internal cache and an external cache that is external to the core and/or the processor. Alternatively, all of the cache may be external to the core and/or the processor.

FIG. 7B is a block diagram illustrating an in-order pipeline and a register renaming stage, out-of-order issue/execution pipeline implemented by processor 700 of FIG. 7A according to some implementations of the disclosure. The solid lined boxes in FIG. 7B illustrate an in-order pipeline 701, while the dashed lined boxes illustrate a register renaming, out-of-order issue/execution pipeline 703. In FIG. 7B, the pipelines 701 and 703 include a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724. In some implementations, the ordering of stages 702-724 may be different than illustrated and are not limited to the specific ordering shown in FIG. 7B.

Figure 8:
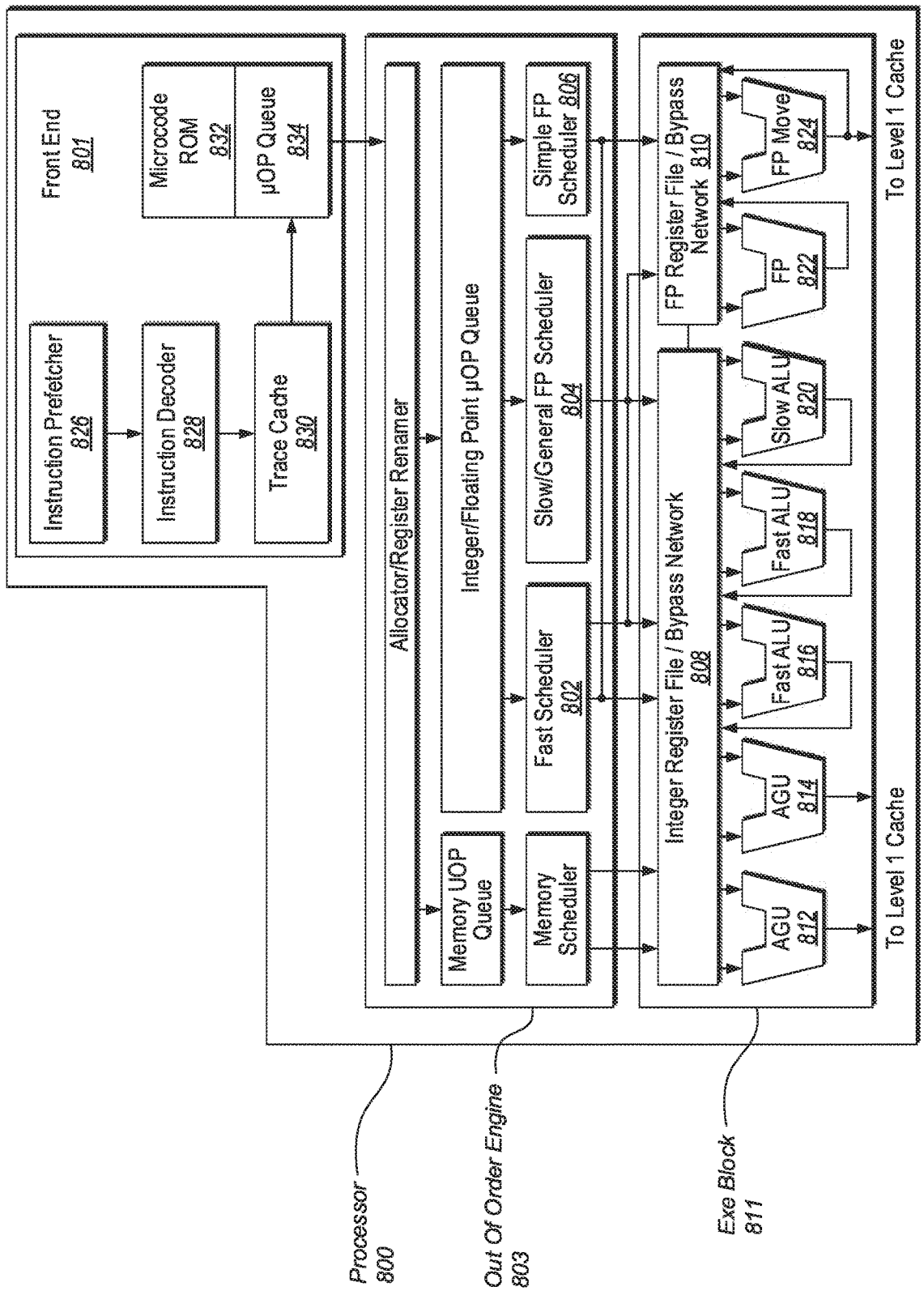
FIG. 8 illustrates a block diagram of the micro-architecture for a processor or an integrated circuit that implements hardware support for dynamic ODT, according to an embodiment of the disclosure.

FIG. 8 illustrates a block diagram of the micro-architecture for a processor 800 that includes logic circuits of a processor or an integrated circuit that implements hardware support for performing dynamic ODT on an inactive device of a multi-chip package to reduce signal reflection and increase parallel bus margins, according to an implementation of the disclosure. In some implementations, an instruction in accordance with one implementation can be implemented to operate on data elements having sizes of byte, word, doubleword, quadword, etc., as well as datatypes, such as single and double precision integer and floating point datatypes. In one implementation the in-order front end 801 is the part of the processor 800 that fetches instructions to be executed and prepares them to be used later in the processor pipeline. The implementations of the page additions and content copying can be implemented in processor 800.

The front end 801 may include several units. In one implementation, the instruction prefetcher 816 fetches instructions from memory and feeds them to an instruction decoder 818 which in turn decodes or interprets them. For example, in one implementation, the decoder decodes a received instruction into one or more operations called "micro-instructions" or "micro-operations" (also called micro op or uops) that the machine can execute. In other implementations, the decoder parses the instruction into an opcode and corresponding data and control fields that are used by the micro-architecture to perform operations in accordance with one implementation. In one implementation, the trace cache 830 takes decoded uops and assembles them into program ordered sequences or traces in the uop queue 834 for execution. When the trace cache 830 encounters a complex instruction, microcode ROM (or RAM) 832 provides the uops needed to complete the operation.

Some instructions are converted into a single micro-op, whereas others need several micro-ops to complete the full operation. In one implementation, if more than four micro-ops are needed to complete an instruction, the decoder 818 accesses the microcode ROM 832 to do the instruction. For one implementation, an instruction can be decoded into a small number of micro ops for processing at the instruction decoder 818. In another implementation, an instruction can be stored within the microcode ROM 832 should a number of micro-ops be needed to accomplish the operation. The trace cache 830 refers to an entry point programmable logic array (PLA) to determine a correct micro-instruction pointer for reading the micro-code sequences to complete one or more instructions in accordance with one implementation from the micro-code ROM 832. After the microcode ROM 832 finishes sequencing micro-ops for an instruction, the front end 801 of the machine resumes fetching micro-ops from the trace cache 830.

The out-of-order execution engine 803 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register set. The allocator also allocates an entry for each uop in one of the two uop queues, one for memory operations and one for non-memory operations, in front of the instruction schedulers: memory scheduler, fast scheduler 802, slow/general floating point scheduler 804, and simple floating point scheduler 806. The uop schedulers 802, 804, 806, determine when a uop is ready to execute based on the readiness of their dependent input register operand sources and the availability of the execution resources the uops need to complete their operation. The fast scheduler 802 of one implementation can schedule on each half of the main clock cycle while the other schedulers can only schedule once per main processor clock cycle. The schedulers arbitrate for the dispatch ports to schedule uops for execution.

Register sets 808, 810, sit between the schedulers 802, 804, 806, and the execution units 812, 814, 816, 818, 820, 822, 824 in the execution block 811. There is a separate register set 808, 810, for integer and floating point operations, respectively. Each register set 808, 810, of one implementation also includes a bypass network that can bypass or forward just completed results that have not yet been written into the register set to new dependent uops. The integer register set 808 and the floating point register set 810 are also capable of communicating data with the other. For one implementation, the integer register set 808 is split into two separate register sets, one register set for the low order 32 bits of data and a second register set for the high order 32 bits of data. The floating point register set 810 of one implementation has 128 bit wide entries because floating point instructions typically have operands from 64 to 128 bits in width.

The execution block 811 contains the execution units 812, 814, 816, 818, 820, 822, 824, where the instructions are actually executed. This section includes the register sets 808, 810, that store the integer and floating point data operand values that the micro-instructions need to execute. The processor 800 of one implementation is comprised of a number of execution units: address generation unit (AGU) 812, AGU 814, fast ALU 816, fast ALU 818, slow ALU 820, floating point ALU 812, floating point move unit 814. For one implementation, the floating point execution blocks 812, 814, execute floating point, MMX, SIMD, and SSE, or other operations. The floating point ALU 812 of one implementation includes a 64 bit by 64 bit floating point divider to execute divide, square root, and remainder micro-ops. For implementations of the disclosure, instructions involving a floating point value may be handled with the floating point hardware.

In one implementation, the ALU operations go to the high-speed ALU execution units 816, 818. The fast ALUs 816, 818, of one implementation can execute fast operations with an effective latency of half a clock cycle. For one implementation, most complex integer operations go to the slow ALU 820 as the slow ALU 820 includes integer execution hardware for long latency type of operations, such as a multiplier, shifts, flag logic, and branch processing. Memory load/store operations are executed by the AGUs 822, 824. For one implementation, the integer ALUs 816, 818, 820, are described in the context of performing integer operations on 64 bit data operands. In alternative implementations, the ALUs 816, 818, 820, can be implemented to support a variety of data bits including 16, 32, 128, 256, etc. Similarly, the floating point units 822, 824, can be implemented to support a range of operands having bits of various widths. For one implementation, the floating point units 822, 824, can operate on 128 bits wide packed data operands in conjunction with SIMD and multimedia instructions.

In one implementation, the uops schedulers 802, 804, 806, dispatch dependent operations before the parent load has finished executing. As uops are speculatively scheduled and executed in processor 800, the processor 800 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one implementation of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an implementation should not be limited in meaning to a particular type of circuit. Rather, a register of an implementation is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one implementation, integer registers store 32-bit integer data. A register set of one implementation also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one implementation, in storing packed data and integer data, the registers do not need to differentiate between the two data types. In one implementation, integer and floating point are either contained in the same register set or different register sets. Furthermore, in one implementation, floating point and integer data may be stored in different registers or the same registers.

Figure 9:
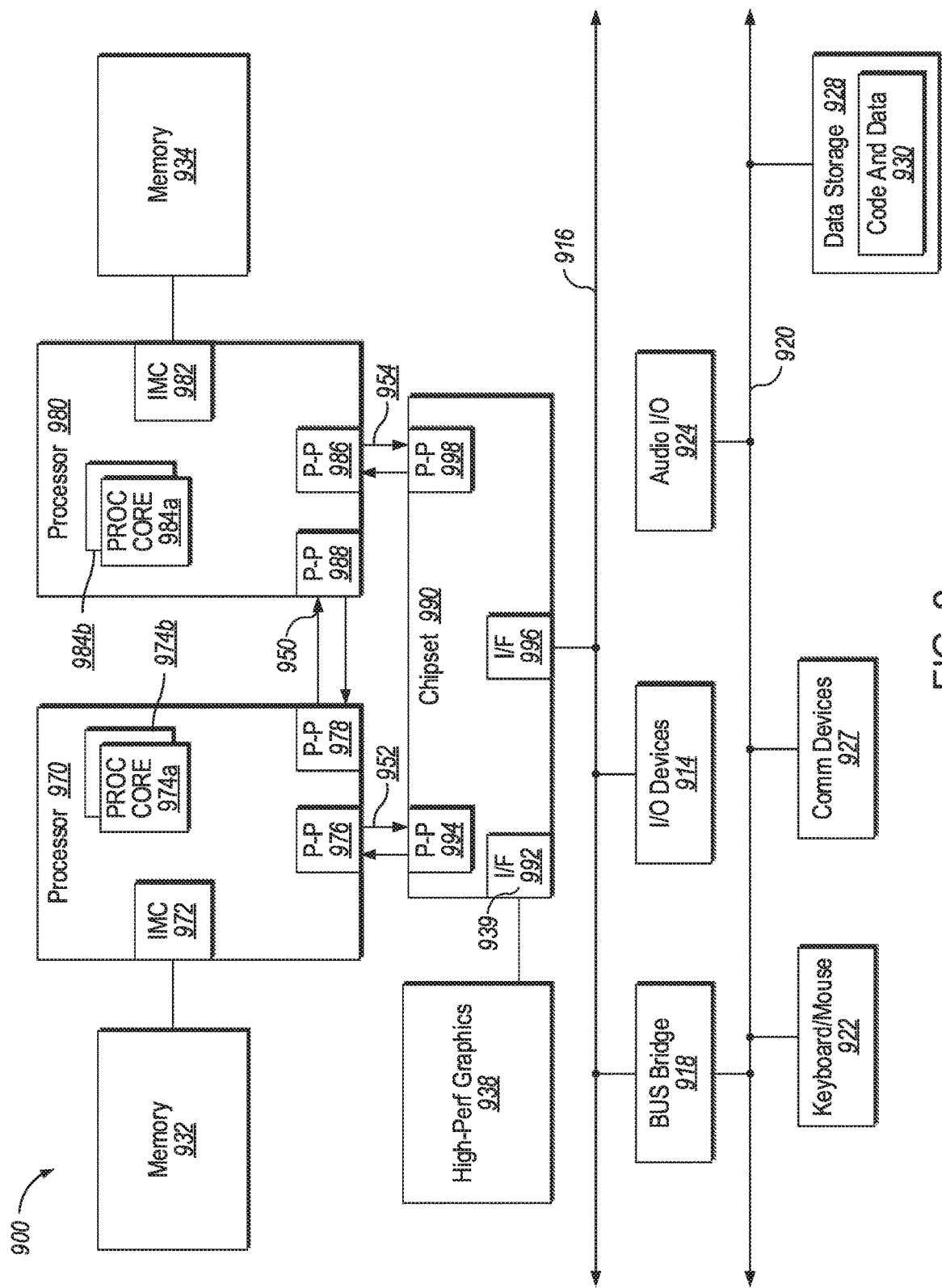
FIG. 9 is a block diagram of a computer system according to one embodiment.

Implementations may be implemented in many different system types. Referring now to FIG. 9, shown is a block diagram of a multiprocessor system 900 that may implement hardware support for performing dynamic ODT on an inactive device of a multi-chip package to reduce signal reflection and increase parallel bus margins. As shown in FIG. 9, multiprocessor system 900 is a point-to-point interconnect system, and includes a first processor 970 and a second processor 980 coupled via a point-to-point interconnect 950. As shown in FIG. 9, each of processors 970 and 980 may be multicore processors, including first and second processor cores (i.e., processor cores 974a and 974b and processor cores 984a and 984b), although potentially many more cores may be present in the processors. While shown with two processors 970, 980, it is to be understood that the scope of the disclosure is not so limited. In other implementations, one or more additional processors may be present in a given processor.

Processors 970 and 980 are shown including integrated memory controller units 972 and 982, respectively. Processor 970 also includes as part of its bus controller units point-to-point (P-P) interfaces 976 and 988; similarly, second processor 980 includes P-P interfaces 986 and 988. Processors 970, 980 may exchange information via a point-to-point (P-P) interface 950 using P-P interface circuits 978, 988. As shown in FIG. 9, IMCs 972 and 982 couple the processors to respective memories, namely a memory 932 and a memory 934, which may be portions of main memory locally attached to the respective processors.

Processors 970, 980 may exchange information with a chipset 990 via individual P-P interfaces 952, 954 using point to point interface circuits 976, 994, 986, 998. Chipset 990 may also exchange information with a high-performance graphics circuit 938 via a high-performance graphics interface 939.

Chipset 990 may be coupled to a first bus 916 via an interface 996. In one implementation, first bus 916 may be a Peripheral Component Interconnect (PCI) bus, or a bus such as a PCI Express bus or interconnect bus, although the scope of the disclosure is not so limited.

Figure 10:
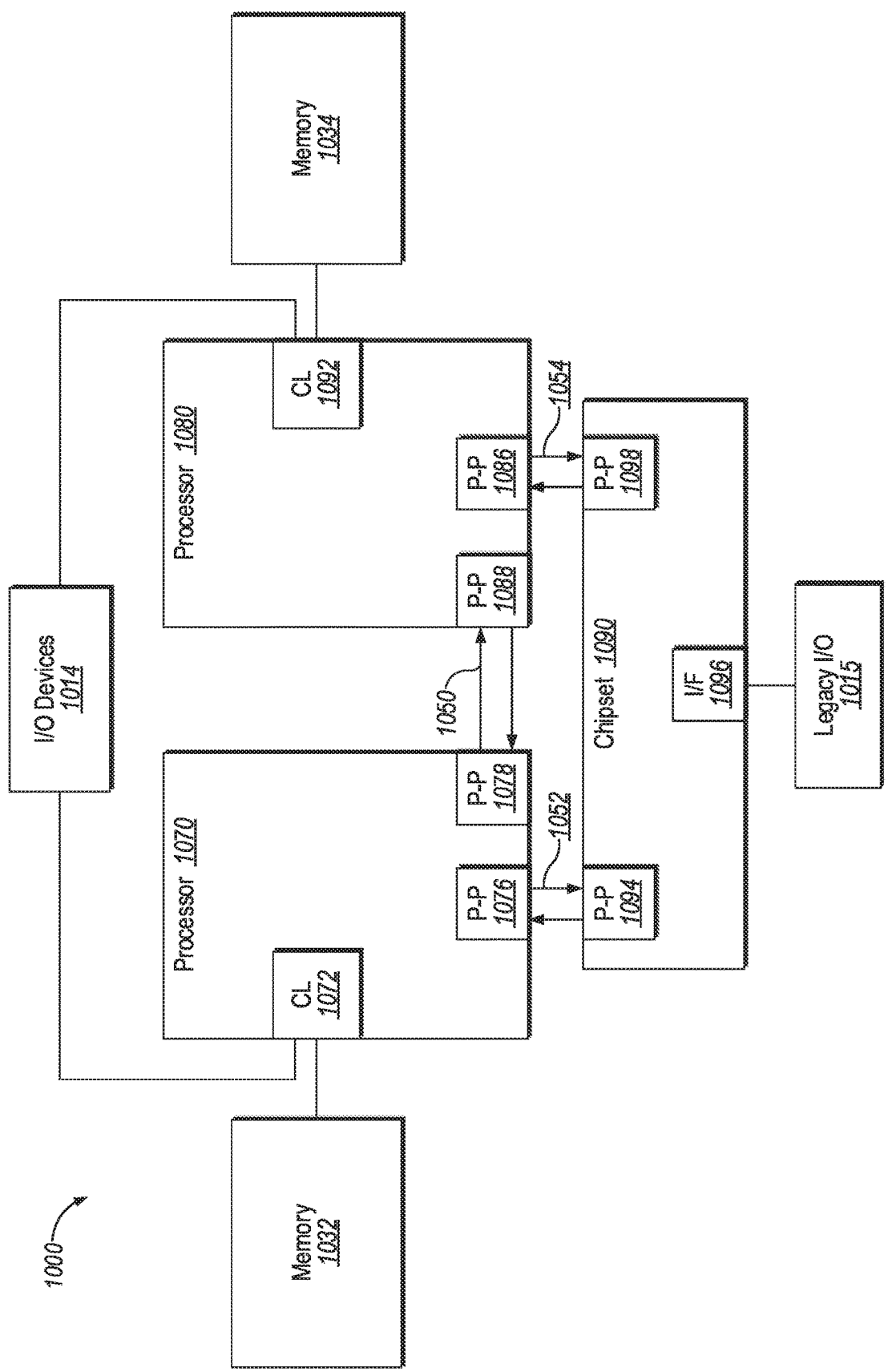
FIG. 10 is a block diagram of a computer system according to another embodiment.

Referring now to FIG. 10, shown is a block diagram of a third system 1000 that may implement hardware support for performing dynamic ODT on an inactive device of a multi-chip package to reduce signal reflection and increase parallel bus margins, in accordance with an implementation of the disclosure. Like elements in FIGS. 9 and 10 bear like reference numerals and certain aspects of FIG. 10 have been omitted from FIG. 9 in order to avoid obscuring other aspects of FIG. 9.

FIG. 10 illustrates that the processors 1070, 1080 may include integrated memory and I/O control logic ("CL") 1072 and 1092, respectively. For at least one implementation, the CL 1072, 1082 may include integrated memory controller units such as described herein. In addition. CL 1072, 1092 may also include I/O control logic. FIG. 10 illustrates that the memories 1032, 1034 are coupled to the CL 1072, 1092, and that I/O devices 1014 are also coupled to the control logic 1072, 1092. Legacy I/O devices 1015 are coupled to the chipset 1090.

Figure 11:
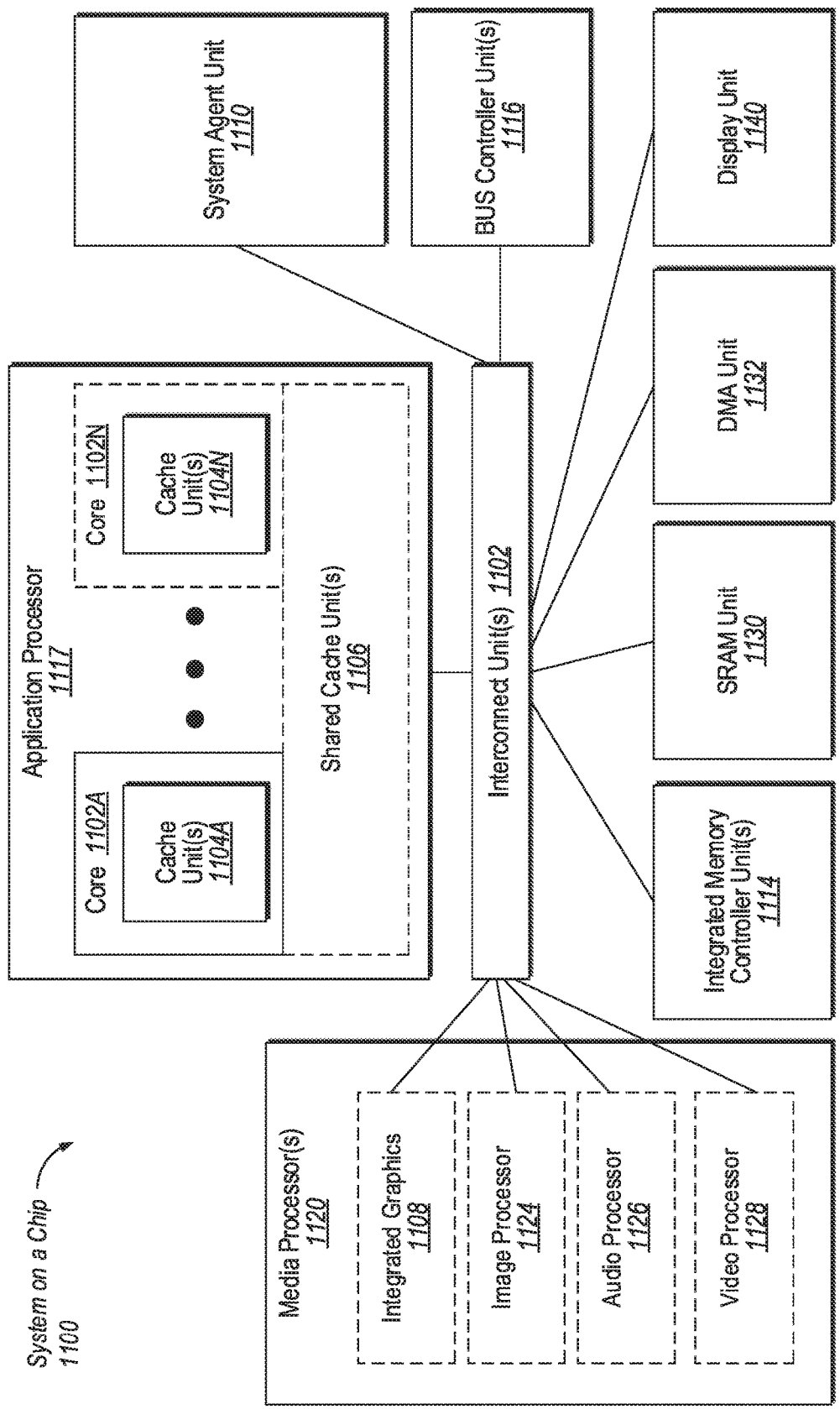
FIG. 11 is a block diagram of a system-on-a-chip according to one embodiment.

FIG. 11 is an exemplary system on a chip (SoC) 1100 that may include one or more of the cores 1102A . . . 1102N that may implement hardware support for performing dynamic ODT on an inactive device of a multi-chip package to reduce signal reflection and increase parallel bus margins. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Within the exemplary SoC 1100 of FIG. 11, dashed lined boxes are features on more advanced SoCs. An interconnect unit(s) 1102 may be coupled to: an application processor 1117 which includes a set of one or more cores 1102A-N and shared cache unit(s) 1106; a system agent unit 1110; a bus controller unit(s) 1116; an integrated memory controller unit(s) 1114; a set of one or more media processors 1120 which may include integrated graphics logic 1108, an image processor 1124 for providing still and/or video camera functionality, an audio processor 1126 for providing hardware audio acceleration, and a video processor 1128 for providing video encode/decode acceleration; a static random access memory (SRAM) unit 1130; a direct memory access (DMA) unit 1132; and a display unit 1140 for coupling to one or more external displays.

Figure 12:
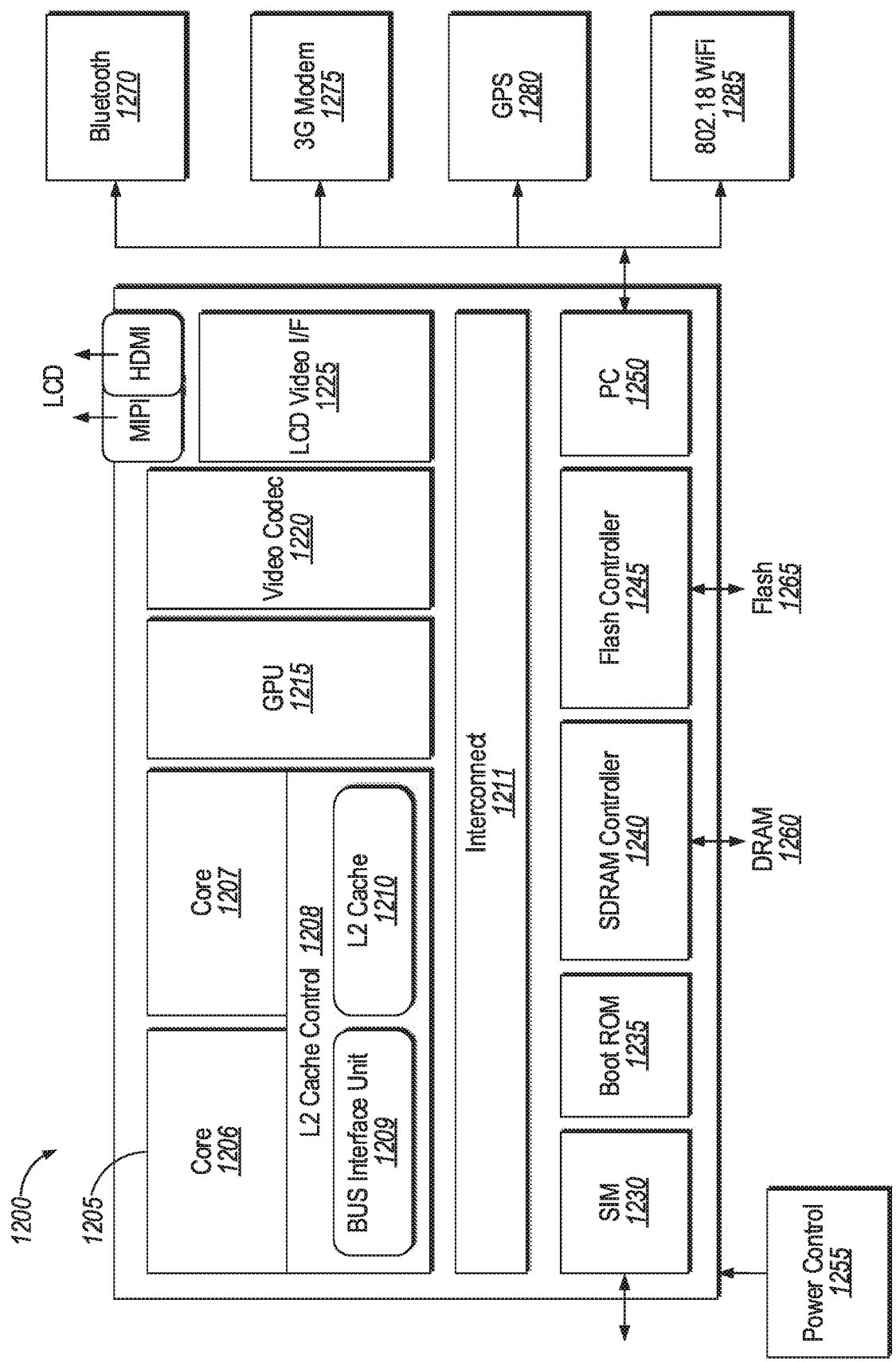
FIG. 12 illustrates another embodiment of a block diagram for a computing system.

Turning next to FIG. 12, an implementation of a system on-chip (SoC) design that may implement hardware support for performing dynamic ODT on an inactive device of a multi-chip package to reduce signal reflection and increase parallel bus margins, in accordance with implementations of the disclosure is depicted. As an illustrative example, SoC 1200 is included in user equipment (UE). In one implementation, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network. The implementations of the page additions and content copying can be implemented in SoC 1200.

Here, SoC 1200 includes 2 cores—1206 and 1207. Similar to the discussion above, cores 1206 and 1207 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1206 and 1207 are coupled to cache control 1208 that is associated with bus interface unit 1209 and L2 cache 1210 to communicate with other parts of system 1200. Interconnect 1211 includes an on-chip interconnect, such as an IOSF, AMBA, or other interconnects discussed above, which can implement one or more aspects of the described disclosure.

In one implementation, SDRAM controller 1240 may connect to interconnect 1211 via cache 1210. Interconnect 1211 provides communication channels to the other components, such as a Subscriber Identity Module (SIM) 1230 to interface with a SIM card, a boot ROM 1235 to hold boot code for execution by cores 1206 and 1207 to initialize and boot SoC 1200, a SDRAM controller 1240 to interface with external memory (e.g. DRAM 1260), a flash controller 1245 to interface with non-volatile memory (e.g. Flash 1265), a peripheral control 1250 (e.g. Serial Peripheral Interface) to interface with peripherals, video codecs 1220 and Video interface 1225 to display and receive input (e.g. touch enabled input), GPU 1215 to perform graphics related computations, etc. Any of these interfaces may incorporate aspects of the implementations described herein.

In addition, the system illustrates peripherals for communication, such as a Bluetooth® module 1270, 3G modem 1275, GPS 1280, and Wi-Fi® 1285. Note as stated above, a UE includes a radio for communication. As a result, these peripheral communication modules may not all be included. However, in a UE some form of a radio for external communication should be included.

Figure 13:
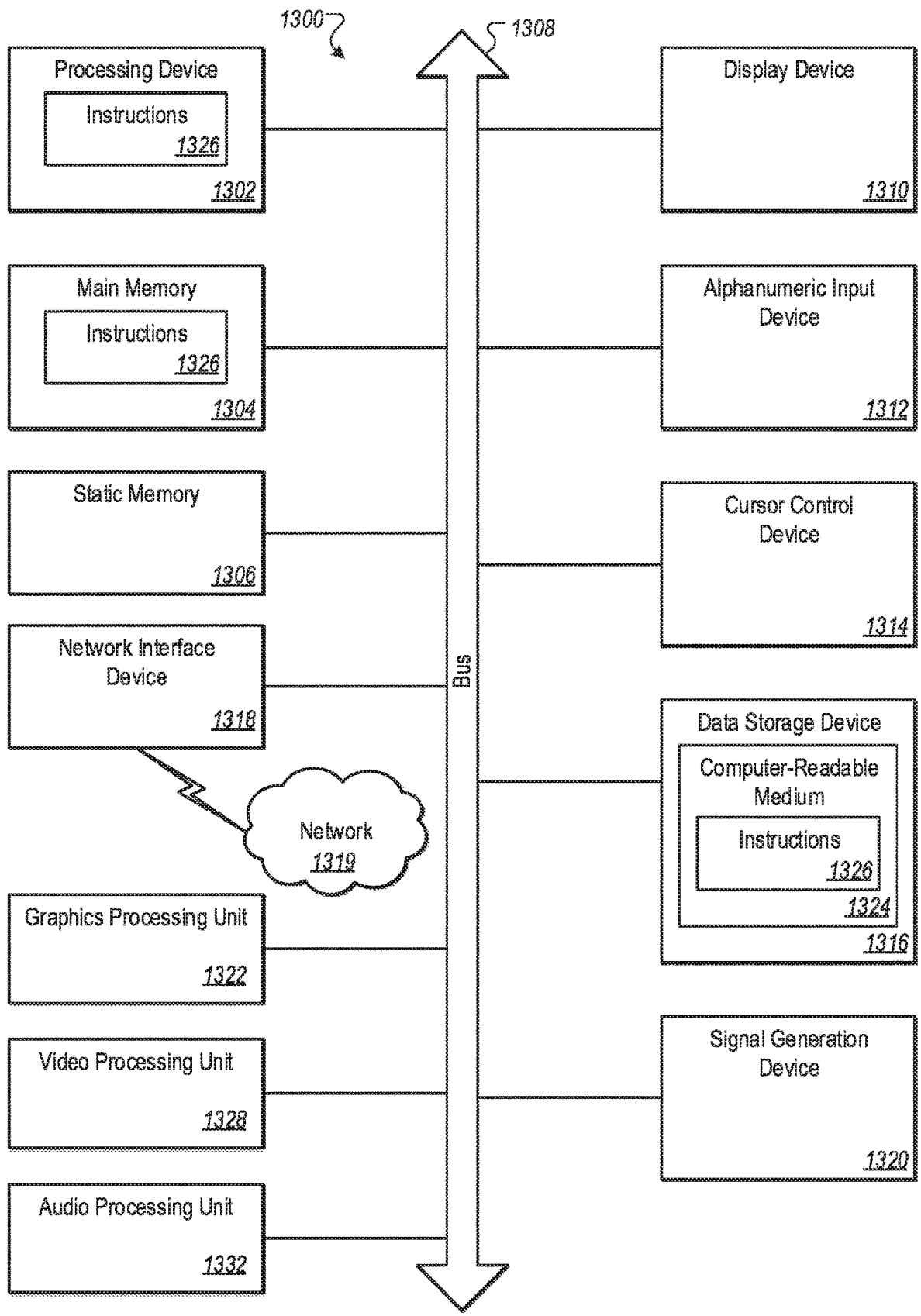
FIG. 13 illustrates another embodiment of a block diagram for a computing system.

FIG. 13 illustrates a diagrammatic representation of a machine in the example form of a computing system 1300 within which a set of instructions, for causing the machine to implement hardware support for performing dynamic ODT on an inactive device of a multi-chip package to reduce signal reflection and increase parallel bus margins, according to any one or more of the methodologies discussed herein. In alternative implementations, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The implementations of the page additions and content copying can be implemented in computing system 1300.

The computing system 1300 includes a processing device 1302, main memory 1304 (e.g., flash memory, dynamic random access memory (DRAM) (such as synchronous DRAM (SDRAM) or DRAM (RDRAM), etc.), a static memory 1306 (e.g., flash memory, static random access memory (SRAM), etc.), and a data storage device 1316, which communicate with each other via a bus 1308.

Processing device 1302 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1302 may also be one or more special-purpose processing devices such as an application-specific integrated circuit (ASIC), a field programmable gate array (FPGA), a digital signal processor (DSP), network processor, or the like. In one implementation, processing device 1302 may include one or more processor cores. The processing device 1302 is configured to execute the processing logic 1326 for performing the operations discussed herein.

In one implementation, processing device 1302 can be part of a processor or an integrated circuit that includes the disclosed LLC caching architecture. Alternatively, the computing system 1300 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1300 may further include a network interface device 1318 communicably coupled to a network 1319. The computing system 1300 also may include a video display device 1310 (e.g., a liquid crystal display (LCD) or a cathode ray tube (CRT)), an alphanumeric input device 1312 (e.g., a keyboard), a cursor control device 1314 (e.g., a mouse), a signal generation device 1320 (e.g., a speaker), or other peripheral devices. Furthermore, computing system 1300 may include a graphics processing unit 1322, a video processing unit 1328 and an audio processing unit 1332. In another implementation, the computing system 1300 may include a chipset (not illustrated), which refers to a group of integrated circuits, or chips, that are designed to work with the processing device 1302 and controls communications between the processing device 1302 and external devices. For example, the chipset may be a set of chips on a motherboard that links the processing device 1302 to very high-speed devices, such as main memory 1304 and graphic controllers, as well as linking the processing device 1302 to lower-speed peripheral buses of peripherals, such as USB, PCI or ISA buses.

The data storage device 1316 may include a computer-readable storage medium 1324 on which is stored software 1326 embodying any one or more of the methodologies of functions described herein. The software 1326 may also reside, completely or at least partially, within the main memory 1304 as instructions 1326 and/or within the processing device 1302 as processing logic during execution thereof by the computing system 1300; the main memory 1304 and the processing device 1302 also constituting computer-readable storage media.

The computer-readable storage medium 1324 may also be used to store instructions 1326 utilizing the processing device 1302, and/or a software library containing methods that call the above applications. While the computer-readable storage medium 1324 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the disclosed implementations. The term "computer-readable storage medium" shall accordingly be taken to include, but not be limited to, solid-state memories, and optical and magnetic media.

The following examples pertain to further implementations.

Example 1 is an apparatus comprising a terminal; a first device coupled to the terminal via a first node, the first device to drive a signal on the terminal via the first node; and a second device coupled to the terminal via a second node, wherein the second device comprises a dynamic on-die termination (ODT) circuit coupled to the second node, the dynamic ODT circuit comprising: a bus holder circuit to receive the signal from the first device at the second node and select a termination voltage based on the signal; a response delay circuit coupled to the bus holder circuit, the response delay circuit to delay application of the termination voltage to the second node; and a time blanking delay circuit coupled to the bus holder circuit and the response delay circuit to prevent the termination voltage from changing before a threshold period of time elapses.

In Example 2, the subject matter of Example 1, wherein, to select the termination voltage based on the signal, the bus holder circuit is to select a first voltage if the signal exceeds a first signal threshold and select a second voltage if the signal is below a second signal threshold, wherein the first voltage is higher than the second voltage.

In Example 3, the subject matter of any one of Examples 1-2, wherein the bus holder circuit comprises a Schmitt trigger.

In Example 4, the subject matter of any one of Examples 1-3, wherein the response delay circuit comprises one or more inverters to delay application of the termination voltage to the second node.

In Example 5, the subject matter of any one of Examples 1-4, wherein the time blanking delay circuit comprises a tunable configuration of one or more logic gates comprising a feedback loop to ensure that the termination voltage remains constant during the threshold period of time.

In Example 6, the subject matter of any one of Examples 1-5, wherein the dynamic ODT circuit further comprises a termination application circuit to apply the termination voltage to the second node of the second device.

In Example 7, the subject matter of any one of Examples 1-6, wherein the second device is in an inactive state while the first device drives the signal, and wherein a signal component generated by application of the termination voltage supplements the signal driven by the first device.

Various implementations may have different combinations of the structural features described above. For instance, all optional features of the processors and methods described above may also be implemented with respect to a system described herein and specifics in the examples may be used anywhere in one or more implementations.

Example 8 is a processing device comprising: a processing core; and a dynamic on-die termination (ODT) circuit coupled to the processing core to terminate a signal received at an interface of the processing device, the dynamic ODT circuit comprising: a first circuit to receive the signal and select a termination voltage based on the signal; a second circuit coupled to the first circuit, the second circuit to delay application of the termination voltage to the interface of the processing device; and a third circuit coupled to the first circuit to prevent the termination voltage from changing before a threshold period of time elapses.

In Example 9, the subject matter of Example 8, wherein to select the termination voltage based on the signal, the first circuit is to select a first voltage if the signal exceeds a first signal threshold and select a second voltage if the signal is below a second signal threshold, wherein the first voltage is higher than the second voltage.

In Example 10, the subject matter of any of Examples 8-9, wherein the first circuit comprises a Schmitt trigger.

In Example 11, the subject matter of any of Examples 8-10, wherein the second circuit comprises one or more inverters to delay propagation of the termination voltage to the interface of the processing device.

In Example 12, the subject matter of any of Examples 8-11, wherein the third circuit comprises a tunable configuration of one or more logic gates comprising a feedback loop to ensure that the termination voltage remains constant during the threshold period of time.

In Example 13, the subject matter of any of Examples 8-12, wherein the dynamic ODT circuit further comprises a fourth circuit to apply the termination voltage to the interface of the processing device.

In Example 14, the subject matter of any of Examples 8-13, wherein the processing device is in an inactive state when the signal is received by the dynamic ODT circuit, and wherein a signal component generated by application of the termination voltage supplements the signal at a signal destination.

Various implementations may have different combinations of the structural features described above. For instance, all optional features of the processors and methods described above may also be implemented with respect to a system described herein and specifics in the examples may be used anywhere in one or more implementations.

Example 15 is method comprising: receiving, at a termination circuit of an inactive device, a signal from an active device that is driving the signal; selecting a termination voltage based on the signal received from the active device; and applying the termination voltage to an output of the termination circuit.

In Example 16, the subject matter of Example 15, prior to applying the termination voltage, applying a time delay to selected termination voltage to delay applying the termination voltage to the output of the termination circuit; determining a time blanking delay for the termination circuit; and applying the time blanking delay to the termination voltage to prevent the termination voltage from changing before a threshold period of time elapses.

In Example 17, the subject matter of any one of Examples 15-16, wherein selecting the termination voltage comprises: determining whether a voltage of the signal exceeds a first voltage threshold; and in response to the voltage of the signal exceeding the first voltage threshold, selecting a first termination voltage.

In Example 18, the subject matter of any one of Examples 15-17, wherein selecting the termination voltage further comprises: determining whether the voltage of the signal is below a second voltage threshold; and in response to the voltage of the signal being below the second voltage threshold, selecting a second termination voltage.

In Example 19, the subject matter of any one of Examples 15-18, wherein the active device is coupled to the inactive device in a single-ended parallel bus configuration.

In Example 20, the subject matter of any one of Examples 15-19, wherein the termination voltage supplements the signal driven by the active device when applied to the output of the termination circuit.

Example 21 is a system comprising means to perform a method of any one of the Examples 15-20.

Example 22 is at least one non-transitory machine readable storage medium comprising a plurality of instructions, when executed, to implement a method or realize an apparatus of any one of Examples 15-20.

Example 23 is an apparatus comprising a processor configured to perform the method of any one of Examples 15-20.

While the disclosure has been described with respect to a limited number of implementations, those skilled in the art will appreciate numerous modifications and variations therefrom. It is intended that the appended claims cover all such modifications and variations as fall within the true spirit and scope of this disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the disclosure. It will be apparent, however, to one skilled in the art that these specific details need not be employed to practice the disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of a computer system have not been described in detail in order to avoid unnecessarily obscuring the disclosure.

The implementations are described with reference to determining validity of data in cache lines of a sector-based cache in specific integrated circuits, such as in computing platforms or microprocessors. The implementations may also be applicable to other types of integrated circuits and programmable logic devices. For example, the disclosed implementations are not limited to desktop computer systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed implementations may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the implementations of methods, apparatuses, and systems described herein (whether in reference to hardware, firmware, software, or a combination thereof) are vital to a 'green technology' future balanced with performance considerations.

Although the implementations herein are described with reference to a processor, other implementations are applicable to other types of integrated circuits and logic devices. Similar techniques and teachings of implementations of the disclosure can be applied to other types of circuits or semiconductor devices that can benefit from higher pipeline throughput and improved performance. The teachings of implementations of the disclosure are applicable to any processor or machine that performs data manipulations. However, the disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of implementations of the disclosure rather than to provide an exhaustive list of all possible implementations of implementations of the disclosure.

Although the above examples describe instruction handling and distribution in the context of execution units and logic circuits, other implementations of the disclosure can be accomplished by way of a data or instructions stored on a machine-readable, tangible medium, which when performed by a machine cause the machine to perform functions consistent with at least one implementation of the disclosure. In one implementation, functions associated with implementations of the disclosure are embodied in machine-executable instructions. The instructions can be used to cause a general-purpose or special-purpose processor that is programmed with the instructions to perform the steps of the disclosure. Implementations of the disclosure may be provided as a computer program product or software which may include a machine or computer-readable medium having stored thereon instructions which may be used to program a computer (or other electronic devices) to perform one or more operations according to implementations of the disclosure. Alternatively, operations of implementations of the disclosure might be performed by specific hardware components that contain fixed-function logic for performing the operations, or by any combination of programmed computer components and fixed-function hardware components.

Instructions used to program logic to perform implementations of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of implementations of the disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one implementation, refers to the hardware, which is specifically configured to recognize and/or execute the code to be held on a non-transitory medium. Furthermore, in another implementation, use of a module refers to the non-transitory medium including the code, which is specifically adapted to be executed by the microcontroller to perform predetermined operations. And as can be inferred, in yet another implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one implementation, use of the term logic includes hardware, such as transistors, registers, or other hardware, such as programmable logic devices.

Use of the phrase 'configured to,' in one implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and/or 'operable to,' in one implementation, refers to some apparatus, logic, hardware, and/or element designed in such a way to enable use of the apparatus, logic, hardware, and/or element in a specified manner. Note as above that use of 'to,' 'capable to,' or 'operable to,' in one implementation, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one implementation, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one implementation, refer to a default and an updated value or state, respectively. For example, a default value potentially includes a high logical value, i.e. reset, while an updated value potentially includes a low logical value, i.e. set. Note that any combination of values may be utilized to represent any number of states.

The implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform implementations of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is, here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus comprising:
a terminal;
a first device coupled to the terminal via a first node, the first device to drive a signal on the terminal via the first node; and
a second device coupled to the terminal via a second node, wherein the second device comprises a dynamic on-die termination (ODT) circuit coupled to the second node, the dynamic ODT circuit comprising:
a bus holder circuit to receive the signal from the first device at the second node and select a termination voltage based on the signal;
a response delay circuit coupled to the bus holder circuit, the response delay circuit to delay application of the termination voltage to the second node; and
a time blanking delay circuit coupled to the bus holder circuit and the response delay circuit to prevent the termination voltage from changing before a threshold period of time elapses.

2. The apparatus of claim 1, wherein, to select the termination voltage based on the signal, the bus holder circuit is to select a first voltage if the signal exceeds a first signal threshold and select a second voltage if the signal is below a second signal threshold, wherein the first voltage is higher than the second voltage.

3. The apparatus of claim 1, wherein the bus holder circuit comprises a Schmitt trigger.

4. The apparatus of claim 1, wherein the response delay circuit comprises one or more inverters to delay application of the termination voltage to the second node.

5. The apparatus of claim 1, wherein the time blanking delay circuit comprises a tunable configuration of one or more logic gates comprising a feedback loop to ensure that the termination voltage remains constant during the threshold period of time.

6. The apparatus of claim 1, wherein the dynamic ODT circuit further comprises a termination application circuit to apply the termination voltage to the second node of the second device.

7. The apparatus of claim 6, wherein the second device is in an inactive state while the first device drives the signal, and wherein a signal component generated by application of the termination voltage supplements the signal driven by the first device.

8. A processing device comprising:
a processing core; and
a dynamic on-die termination (ODT) circuit coupled to the processing core to terminate a signal received at an interface of the processing device, the dynamic ODT circuit comprising:
a first circuit to receive the signal and select a termination voltage based on the signal;
a second circuit coupled to the first circuit, the second circuit to delay application of the termination voltage to the interface of the processing device; and
a third circuit coupled to the first circuit to prevent the termination voltage from changing before a threshold period of time elapses.

9. The processing device of claim 8, wherein to select the termination voltage based on the signal, the first circuit is to select a first voltage if the signal exceeds a first signal threshold and select a second voltage if the signal is below a second signal threshold, wherein the first voltage is higher than the second voltage.

10. The processing device of claim 8, wherein the first circuit comprises a Schmitt trigger.

11. The processing device of claim 8, wherein the second circuit comprises one or more inverters to delay propagation of the termination voltage to the interface of the processing device.

12. The processing device of claim 8, wherein the third circuit comprises a tunable configuration of one or more logic gates comprising a feedback loop to ensure that the termination voltage remains constant during the threshold period of time.

13. The processing device of claim 8, wherein the dynamic ODT circuit further comprises a fourth circuit to apply the termination voltage to the interface of the processing device.

14. The processing device of claim 8, wherein the processing device is in an inactive state when the signal is received by the dynamic ODT circuit, and wherein a signal component generated by application of the termination voltage supplements the signal at a signal destination.

15. A method comprising:
receiving, at a termination circuit of an inactive device, a signal from an active device that is driving the signal;
selecting a termination voltage based on the signal received from the active device;
prior to applying the termination voltage, applying a time delay to selected termination voltage to delay applying the termination voltage to an output of the termination circuit;
applying the termination voltage to the output of the termination circuit,
determining a time blanking delay for the termination circuit; and
applying the time blanking delay to the termination voltage to prevent the termination voltage from changing before a threshold period of time elapses.

16. The method of claim 15, wherein selecting the termination voltage comprises:
determining whether a voltage of the signal exceeds a first voltage threshold; and
in response to the voltage of the signal exceeding the first voltage threshold, selecting a first termination voltage.

17. The method of claim 16, wherein selecting the termination voltage further comprises:
determining whether the voltage of the signal is below a second voltage threshold; and
in response to the voltage of the signal being below the second voltage threshold, selecting a second termination voltage.

18. The method of claim 15, wherein the active device is coupled to the inactive device in a single-ended parallel bus configuration.

19. The method of claim 15, wherein the termination voltage supplements the signal driven by the active device when applied to the output of the termination circuit.

* * * * *